(12) United States Patent
Yang et al.

(10) Patent No.: US 8,017,183 B2
(45) Date of Patent: Sep. 13, 2011

(54) ORGANOSILOXANE MATERIALS FOR SELECTIVE AREA DEPOSITION OF INORGANIC MATERIALS

(75) Inventors: Cheng Yang, Pittsford, NY (US); Lyn M. Irving, Rochester, NY (US); David H. Levy, Rochester, NY (US); Peter J. Cowdery-Corvan, Webster, NY (US); Diane C. Freeman, Pittsford, NY (US)

(73) Assignee: Eastman Kodak Company, Rochester, NY (US)

(*) Notice: Subject to any disclaimer, the term of this patent is extended or adjusted under 35 U.S.C. 154(b) by 1021 days.

(21) Appl. No.: 11/861,705

(22) Filed: Sep. 26, 2007

(65) Prior Publication Data

US 2009/0081374 A1   Mar. 26, 2009

(51) Int. Cl.
*C23C 16/00* (2006.01)
(52) U.S. Cl. .................. 427/248.1; 427/98.4
(58) Field of Classification Search ............... None
See application file for complete search history.

(56) References Cited

U.S. PATENT DOCUMENTS

| | | | |
|---|---|---|---|
| 4,413,022 A | 11/1983 | Suntola et al. | |
| 6,518,168 B1 * | 2/2003 | Clem et al. | 438/623 |
| 6,821,563 B2 * | 11/2004 | Yudovsky | 427/248.1 |
| 7,160,819 B2 | 1/2007 | Conley, Jr. et al. | |
| 2004/0087143 A1 * | 5/2004 | Norman et al. | 438/680 |
| 2005/0084610 A1 * | 4/2005 | Selitser | 427/248.1 |
| 2005/0183767 A1 * | 8/2005 | Yu et al. | 136/263 |
| 2007/0128859 A1 * | 6/2007 | Chudzik et al. | 438/680 |

FOREIGN PATENT DOCUMENTS

WO    WO 97/07429 A    2/1997

OTHER PUBLICATIONS

Yan, Applied Physics Letters, vol. 79, No. 11, p. 1709-1711, 2001.*
Zubkov, J. Phys. Chem B, 2005, 109, 14144-14153.*
Jiang et al.: "Spatial Control Over Atomic Layer Deposition Using Microcontact-Printed Resists", Surface and Coatings Technology, Elsevier, Amsterdam, NL, vol. 201, No. 22-23, Aug. 9, 2007, pp. 8799-8807, XP022191887, ISSN: 0257-8972.
Sinha Ashwini et al.: "Area Selective Atomic Layer Deposition of Titanium Dioxide: Effect of Precursor Chemistry", Journal of Vacuum Science and Technology: Part B, AVS/AIP, Melvillle, New York, NY, US, vol. 24, No. 6, Oct. 30, 2006, pp. 2523-2532, XP012091696, ISSN: 1071-1023.
U.S. Appl. No. 11/392,006, filed Mar. 29, 2006, David H. Levy.
U.S. Appl. No. 11/392,007, filed Mar. 29, 2006, David H. Levy.
U.S. Appl. No. 11/620,738, filed Jan. 8, 2007, David H. Levy.
U.S. Appl. No. 11/620,740, filed Jan. 8, 2007, Shelby F. Nelson et al.

* cited by examiner

*Primary Examiner* — Timothy H Meeks
*Assistant Examiner* — Joseph Miller, Jr.
(74) *Attorney, Agent, or Firm* — Chris P. Konkol; J. Lanny Tucker

(57) ABSTRACT

An atomic-layer-deposition process for forming a patterned thin film comprising providing a substrate, applying a deposition inhibitor material to the substrate, wherein the deposition inhibitor material is an organosiloxane compound; and patterning the deposition inhibitor material either after or simultaneously with or introducing applying the deposition inhibitor material to provide selected areas of the substrate effectively not having the deposition inhibitor material. The thin film is substantially deposited only in the selected areas of the substrate not having the deposition inhibitor material.

20 Claims, 17 Drawing Sheets

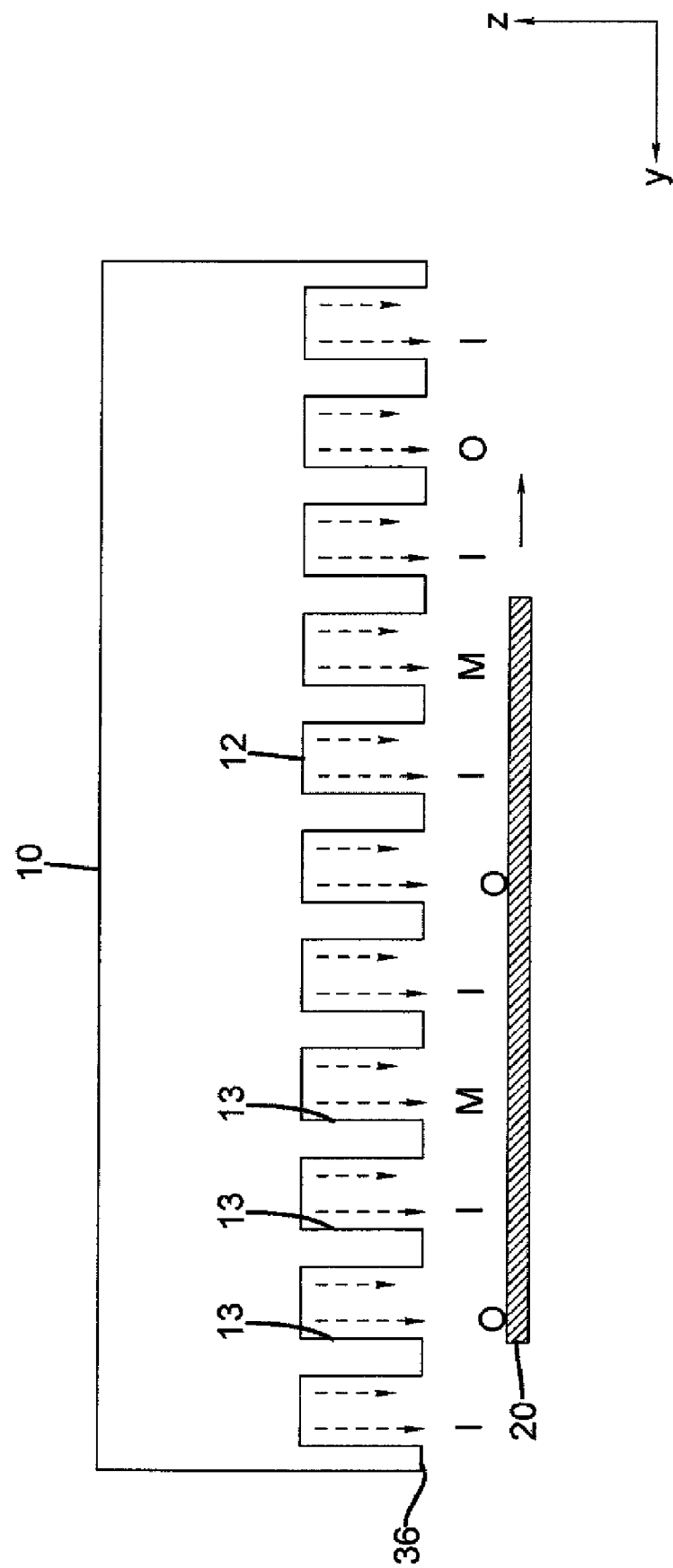

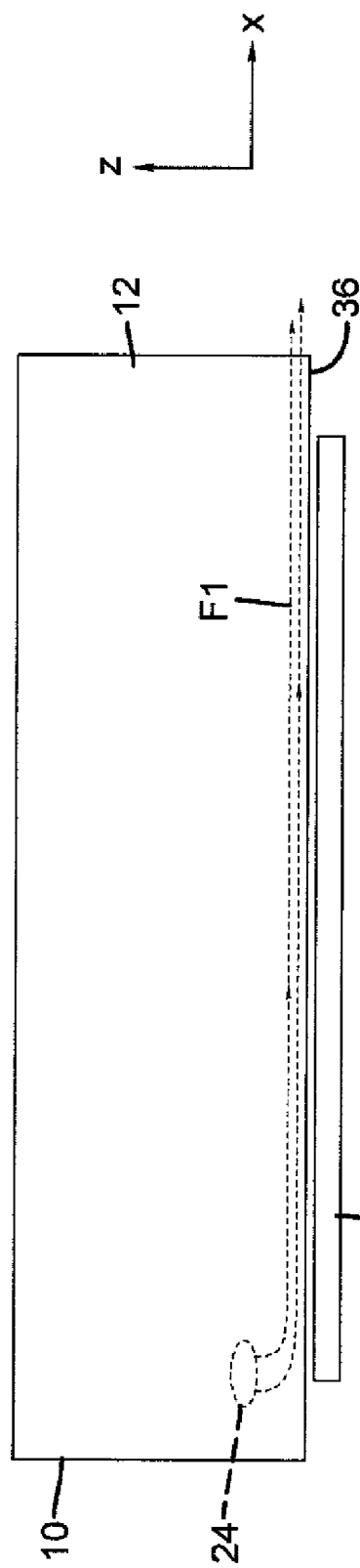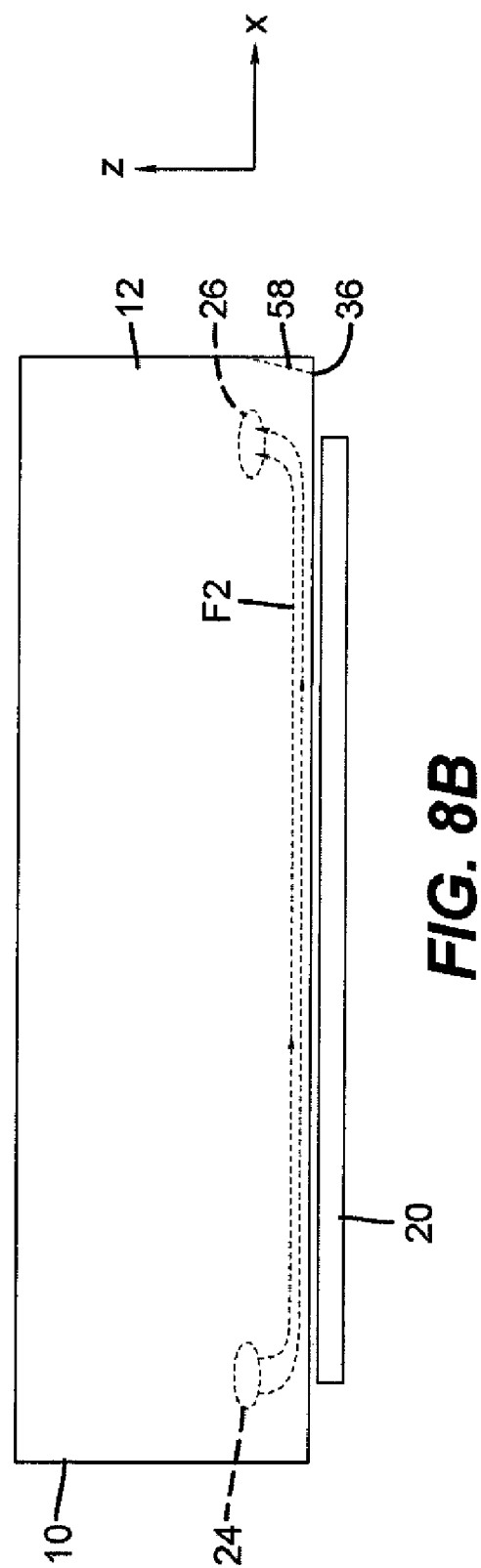

ORGANOSILOXANE MATERIALS FOR SELECTIVE AREA DEPOSITION OF INORGANIC MATERIALS

CROSS-REFERENCE TO RELATED APPLICATIONS

The present application is related to U.S. Pat. Nos. 7,413,982, 7,456,429 (Levy), U.S. Application Publication No. (Levy), U.S. Pat. No. 7,789,961 (Nelson et al.) U.S. Application Publication Nos. 2009/0078204 and 2009/0081366-Kerr et al.) U.S. Application Pat. No. 7,572,686 (Levy et al.) and U.S. Application Publication No. 2009/0081827 (Yang et al.) all the above identified applications hereby incorporated by reference in their entirety.

FIELD OF THE INVENTION

This invention generally relates to the selective area deposition of thin film metals, metal oxide materials, and the like, in a process using atomic layer deposition of such materials onto a substrate. In particular, the present invention relates to organosiloxane compounds useful as deposition inhibitor materials in selective area deposition.

BACKGROUND OF THE INVENTION

Modern-day electronics require multiple patterned layers of electrically or optically active materials, sometimes over a relatively large substrate. Electronics such radio frequency identification (RFID) tags, photovoltaics, optical and chemical sensors all require some level of patterning in their electronic circuitry. Flat panel displays, such as liquid crystal displays or electroluminescent displays (ex. OLED), rely upon accurately patterned sequential layers to form thin film components of the backplane. These components include capacitors, transistors, and power buses. The industry is continually looking for new methods of materials deposition and layer patterning for both performance gains and cost reductions.

Thin film transistors (TFTs) may be viewed as representative of the electronic and manufacturing issues for many thin film components. TFTs are widely used as switching elements in electronics, for example, in active-matrix liquid-crystal displays, smart cards, and a variety of other electronic devices and components thereof. The thin film transistor (TFT) is an example of a field effect transistor (FET). The best-known example of an FET is the MOSFET (Metal-Oxide-Semiconductor-FET), today's conventional switching element for high-speed applications. For applications in which a transistor needs to be applied to a substrate, a thin film transistor is typically used. A critical step in fabricating the thin film transistor involves the deposition of a semiconductor onto the substrate. Presently, most thin film devices are made using vacuum deposited amorphous silicon as the semiconductor, which is patterned using traditional photolithographic methods.

Amorphous silicon as a semiconductor for use in TFTs still has its drawbacks. The deposition of amorphous silicon, during the manufacture of transistors, requires relatively difficult or complicated processes such as plasma enhanced chemical vapor deposition and high temperatures (typically about 360° C.) to achieve the electrical characteristics sufficient for display applications. Such high processing temperatures disallow deposition on substrates made of certain plastics that might otherwise be desirable for use in applications such as flexible displays.

There is a growing interest in depositing thin film semiconductors on plastic or flexible substrates, particularly because these supports would be more mechanically robust, lighter weight, and allow more economic manufacturing, for example, by allowing roll-to-roll processing. A useful example of a flexible substrate is polyethylene terephthalate. Such plastics, however, limit device processing to below 200° C.

In spite of the potential advantages of flexible substrates, there are many issues associated with plastic supports when using traditional photolithography during conventional manufacturing, making it difficult to perform alignments of transistor components across typical substrate widths up to one meter or more. Traditional photolithographic processes and equipment may be seriously impacted by the substrate's maximum process temperature, solvent resistance, dimensional stability, water, and solvent swelling, all key parameters in which plastic supports are typically inferior to glass.

There is interest in utilizing lower cost processes for deposition that do not involve the expense associated with vacuum processing and patterning with photolithography. In typical vacuum processing, a large metal chamber and sophisticated vacuum pumping systems are required in order to provide the necessary environment. In typical photolithographic systems, much of the material deposited in the vacuum chamber is removed. The deposition and photolithography items have high capital costs and preclude the easy use of continuous web based systems.

In the past decade, various materials have received attention as a potential alternative to amorphous silicon for use in semiconductor channels of thin film transistors. Semiconductor materials are desirable that are simpler to process, especially those that are capable of being applied to large areas by relatively simple processes. Semiconductor materials that can be deposited at lower temperatures would open up a wider range of substrate materials, including plastics, for flexible electronic devices. Dielectric materials that are easily processable and patternable are also key to the success of low cost and flexible electronic devices.

The discovery of practical inorganic semiconductors as a replacement for current silicon-based technologies has also been the subject of considerable research efforts. For example, metal oxide semiconductors are known that constitute zinc oxide, indium oxide, gallium indium zinc oxide, tin oxide, or cadmium oxide deposited with or without additional doping elements including metals such as aluminum. Such semiconductor materials, which are transparent, can have an additional advantage for certain applications, as discussed below. Additionally, metal oxide dielectrics such as alumina ($Al_2O_3$) and $TiO_2$ are useful in practical electronics applications as well as optical applications such as interference filters.

Although successful thin films in electronic devices have been made with sputtering techniques, it is clear that very precise control over the reactive gas composition (such as oxygen content) is required to produce good quality devices. Chemical vapor deposition (CVD) techniques, in which two reactive gasses are mixed to form the desired film material, can be useful routes to achieving high quality film growth. Atomic layer deposition ("ALD") is yet an alternative film deposition technology that can provide improved thickness resolution and conformal capabilities, compared to its CVD predecessor. The ALD process segments the conventional thin-film deposition process of conventional CVD into single atomic-layer deposition steps.

ALD can be used as a fabrication step for forming a number of types of thin-film electronic devices, including semiconductor devices and supporting electronic components such as resistors and capacitors, insulators, bus lines, and other conductive structures. ALD is particularly suited for forming thin layers of metal oxides in the components of electronic devices. General classes of functional materials that can be deposited with ALD include conductors, dielectrics or insulators, and semiconductors.

Examples of useful semiconducting materials are compound semiconductors such as gallium arsenide, gallium nitride, cadmium sulfide, zinc oxide, and zinc sulfide.

A number of device structures can be made with the functional layers described above. A capacitor results from placing a dielectric between two conductors. A diode results from placing two semiconductors of complementary carrier type between two conducting electrodes. There may also be disposed between the semiconductors of complementary carrier type a semiconductor region that is intrinsic, indicating that that region has low numbers of free charge carriers. A diode may also be constructed by placing a single semiconductor between two conductors, where one of the conductor/semiconductors interfaces produces a Schottky barrier that impedes current flow strongly in one direction. A transistor results from placing upon a conductor (the gate) an insulating layer followed by a semiconducting layer. If two or more additional conductor electrodes (source and drain) are placed spaced apart in contact with the top semiconductor layer, a transistor can be formed. Any of the above devices can be created in various configurations as long as the critical interfaces are created.

Advantageously, ALD steps are self-terminating and can deposit precisely one atomic layer when conducted up to or beyond self-termination exposure times. An atomic layer typically ranges from about 0.1 to about 0.5 molecular monolayers, with typical dimensions on the order of no more than a few Angstroms. In ALD, deposition of an atomic layer is the outcome of a chemical reaction between a reactive molecular precursor and the substrate. In each separate ALD reaction-deposition step, the net reaction deposits the desired atomic layer and substantially eliminates "extra" atoms originally included in the molecular precursor. In its most pure form, ALD involves the adsorption and reaction of each of the precursors in the complete absence of the other precursor or precursors of the reaction. In practice in any process it is difficult to avoid some direct reaction of the different precursors leading to a small amount of chemical vapor deposition reaction. The goal of any process claiming to perform ALD is to obtain device performance and attributes commensurate with an ALD process while recognizing that a small amount of CVD reaction can be tolerated.

In ALD applications, typically two molecular precursors are introduced into the ALD reactor in separate stages. For example, a metal precursor molecule, $ML_x$, comprises a metal element, M that is bonded to an atomic or molecular ligand, L. For example, M could be, but would not be restricted to, Al, W, Ta, Si, Zn, etc. The metal precursor reacts with the substrate when the substrate surface is prepared to react directly with the molecular precursor. For example, the substrate surface typically is prepared to include hydrogen-containing ligands, AH or the like, that are reactive with the metal precursor. Sulfur (S), oxygen (O), and Nitrogen (N) are some typical A species. The gaseous precursor molecule effectively reacts with all of the ligands on the substrate surface, resulting in deposition of a single atomic layer of the metal:

$$\text{substrate-AH} + ML_x \rightarrow \text{substrate-}AML_{x-1} + HL \quad (1)$$

where HL is a reaction by-product. During the reaction, the initial surface ligands, AH, are consumed, and the surface becomes covered with $AML_{x-1}$ ligands, which cannot further react with metal precursor $ML_x$. Therefore, the reaction self-terminates when all of the initial AH ligands on the surface are replaced with $AML_{x-1}$ species. The reaction stage is typically followed by an inert-gas purge stage that eliminates the excess metal precursor and the HL by-product species from the chamber prior to the separate introduction of the other precursor.

A second molecular precursor then is used to restore the surface reactivity of the substrate towards the metal precursor. This is done, for example, by removing the L ligands and re-depositing AH ligands. In this case, the second precursor typically comprises the desired (usually nonmetallic) element A (i.e., O, N, S), and hydrogen (i.e., $H_2O$, $NH_3$, $H_2S$). The next reaction is as follows:

$$\text{substrate-A-ML} + AH_y \rightarrow \text{substrate-A-M-AH} + HL \quad (2)$$

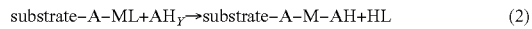

This converts the surface back to its AH-covered state. (Here, for the sake of simplicity, the chemical reactions are not balanced.) The desired additional element, A, is incorporated into the film and the undesired ligands, L, are eliminated as volatile by-products. Once again, the reaction consumes the reactive sites (this time, the L terminated sites) and self-terminates when the reactive sites on the substrate are entirely depleted. The second molecular precursor then is removed from the deposition chamber by flowing inert purge-gas in a second purge stage.

In summary, then, an ALD process requires alternating in sequence the flux of chemicals to the substrate. The representative ALD process, as discussed above, is a cycle having four different operational stages:
1. $ML_x$ reaction;
2. $ML_x$ purge;
3. $AH_y$ reaction; and
4. $AH_y$ purge, and then back to stage 1.

This repeated sequence of alternating surface reactions and precursor-removal that restores the substrate surface to its initial reactive state, with intervening purge operations, is a typical ALD deposition cycle. A key feature of ALD operation is the restoration of the substrate to its initial surface chemistry condition. Using this repeated set of steps, a film can be layered onto the substrate in equal metered layers that are all identical in chemical kinetics, deposition per cycle, composition, and thickness.

Self-saturating surface reactions make ALD insensitive to transport non-uniformities, which might otherwise impair surface uniformity, due either to engineering tolerances and the limitations of the flow process or related to surface topography (that is, deposition into three dimensional, high aspect ratio structures). As a general rule, a non-uniform flux of chemicals in a reactive process generally results in different completion times at different areas. However, with ALD, each of the reactions is allowed to complete on the entire substrate surface. Thus, differences in completion kinetics impose no penalty on uniformity. This is because the areas that are first to complete the reaction self-terminate the reaction; other areas are able to continue until the full treated surface undergoes the intended reaction.

Typically, an ALD process deposits about 0.1-0.2 nm of a film in a single ALD cycle (with numbered steps 1 through 4 as listed earlier). A useful and economically feasible cycle time must be achieved in order to provide a uniform film thickness in a range of from about 3 nm to 300 nm for many or most semiconductor applications, and even thicker films for other applications. Industry throughput standards dictate that substrates be processed in 2 minutes to 3 minutes, which means that ALD cycle times must be in a range from about 0.6 seconds to about 6 seconds.

An ALD process must be able to execute this sequencing efficiently and reliably for many cycles in order to allow cost-effective coating of many substrates. In an effort to minimize the time that an ALD reaction needs to reach self-termination, at any given reaction temperature, one approach has been to maximize the flux of chemicals flowing into the ALD reactor, using a so-called "pulsing" process. In the pulsed ALD process, a substrate sits in a chamber and is exposed to the above sequence of gases by allowing a first gas to enter the chamber, followed by a pumping cycle to remove that gas, followed by the introduction of a second gas to the chamber, followed by a pumping cycle to remove the second gas. This sequence can be repeated at any frequency and variations in gas type and/or concentration. The net effect is that the entire chamber experiences a variation in gas composition with time, and thus this type of ALD can be referred to as time dependent ALD. The vast majority of existing ALD processes are time dependent ALD.

In order to maximize the flux of chemicals into the ALD reactor, it is advantageous to introduce the molecular precursors into the ALD reactor with minimum dilution of inert gas and at high pressures. However, these measures work against the need to achieve short cycle times and the rapid removal of these molecular precursors from the ALD reactor. Rapid removal in turn dictates that gas residence time in the ALD reactor be minimized.

Existing ALD approaches have been compromised with the trade-off between the need to shorten reaction times and improve chemical utilization efficiency, and on the other hand, the need to minimize purge-gas residence and chemical removal times. One approach to overcome the inherent limitations of time depended ALD systems is to provide each reactant gas continuously and to move the substrate through each gas in succession. In these systems a relatively constant gas composition exists, but is located to specific areas or spaces of the processing system. Therefore, these systems will be referred to as spatially dependent ALD systems.

For example, U.S. Pat. No. 6,821,563 entitled "GAS DISTRIBUTION SYSTEM FOR CYCLICAL LAYER DEPOSITION" to Yudovsky describes a spatially dependent ALD processing system, under vacuum, having separate gas ports for precursor and purge gases, alternating with vacuum pump ports between each gas port. Each gas port directs its stream of gas vertically downward toward a substrate. Walls or partitions separate the gas flows, with vacuum pumps for evacuating gas on both sides of each gas stream. A lower portion of each partition extends close to the substrate, for example, about 0.5 mm or greater from the substrate surface. In this manner, the lower portions of the partitions are separated from the substrate surface by a distance sufficient to allow the gas streams to flow around the lower portions toward the vacuum ports after the gas streams react with the substrate surface.

A rotary turntable or other transport device is provided for holding one or more substrate wafers. With this arrangement, the substrate is shuttled beneath the different gas streams, effecting ALD deposition thereby. In one embodiment, the substrate is moved in a linear path through a chamber, in which the substrate is passed back and forth a number of times.

Another approach using continuous gas flow spatially dependent ALD is shown in U.S. Pat. No. 4,413,022 entitled "METHOD FOR PERFORMING GROWTH OF COMPOUND THIN FILMS" to Suntola et al. A gas flow array is provided with alternating source gas openings, carrier gas openings, and vacuum exhaust openings. Reciprocating motion of the substrate over the array effects ALD deposition, again, without the need for pulsed operation. In the embodiment of FIGS. 13 and 14, in particular, sequential interactions between a substrate surface and reactive vapors are made by a reciprocating motion of the substrate over a fixed array of source openings. Diffusion barriers are formed by a carrier gas opening between exhaust openings. Suntola et al. state that operation with such an embodiment is possible even at atmospheric pressure, although little or no details of the process, or examples, are provided.

While processes such as those described in the '563 Yudovsky and '022 Suntola et al. patents may avoid some of the difficulties inherent to pulsed gas approaches, these processes have other drawbacks. For example, it would be very difficult to maintain a uniform vacuum at different points in an array and to maintain synchronous gas flow and vacuum at complementary pressures, thus compromising the uniformity of gas flux that is provided to the substrate surface. Neither the gas flow delivery unit of the '563 Yudovsky patent nor the gas flow array of the '022 Suntola et al. patent can be used in closer proximity to the substrate than about 0.5 mm.

U.S. Patent Publication No. 2005/0084610 to Selitser discloses an atmospheric pressure atomic layer chemical vapor deposition process. Selitser states that extraordinary increases in reaction rates are obtained by changing the operating pressure to atmospheric pressure, which will involve orders of magnitude increase in the concentration of reactants, with consequent enhancement of surface reactant rates. The embodiments of Selitser involve separate chambers for each stage of the process, although FIG. 10 shows an embodiment in which chamber walls are removed. A series of separated injectors are spaced around a rotating circular substrate holder track. Each injector incorporates independently operated reactant, purging, and exhaust gas manifolds and controls and acts as one complete mono-layer deposition and reactant purge cycle for each substrate as is passes there under in the process. Little or no specific details of the gas injectors or manifolds are described by Selitser, although it is stated that spacing of the injectors is selected so that cross-contamination from adjacent injectors is prevented by purging gas flows and exhaust manifolds incorporated in each injector.

A spatially dependent ALD process can be accomplished with other apparatus or systems described in more detail in U.S. Publication No. 2009/0130858 (Levy). All these identified applications hereby incorporated by reference in their entirety. These systems attempt to overcome one of the difficult aspects of a spatial ALD system, which is undesired intermixing of the continuously flowing mutually reactive gases. In particular, U.S. Pat. No. 7,413,982 employs a novel transverse flow pattern to prevent intermixing, while U.S. Publication No. 2009/0130858 and U.S. Pat. No. 7,789,961 employ a coating head partially levitated by the pressure of the reactive gases of the process to accomplish improved gas separation.

There is growing interest in combining ALD with a technology known as selective area deposition, or SAD. As the name implies, selective area deposition involves treating portion(s) of a substrate such that a material is deposited only in those areas that are desired, or selected. Sinha et al. (J. Vac. Sci. Technol. B 24 6 2523-2532 (2006)) have remarked that selective area ALD requires that designated areas of a surface be masked or "protected" to prevent ALD reactions in those selected areas, thus ensuring that the ALD film nucleates and grows only on the desired unmasked regions. It is also possible to have SAD processes where the selected areas of the surface area are "activated" or surface modified in such a way that the film is deposited only on the activated areas. There are many potential advantages to selective area deposition techniques, such as eliminating an etch process for film patterning, reduction in the number of cleaning steps required, and patterning of materials which are difficult to etch. One approach to combining patterning and depositing the semiconductor is shown in U.S. Pat. No. 7,160,819 entitled "METHOD TO PERFORM SELECTIVE ATOMIC LAYER DEPOSITION OF ZINC OXIDE" by Conley et al. Conley et al. discuss materials for use in patterning Zinc Oxide on silicon wafers. No information is provided on the use of other substrates, or the results for other metal oxides.

A number of a materials have been used by researchers as director inhibitor compounds for selective area deposition. Sinha et al., referenced above, use poly(methyl methacrylate (PMMA) in their masking layer. Conley et al. employed acetone and deionized water, along with other process contaminants as deposition inhibitor materials. The problem with these previously used director inhibitors is that they are only effective to direct selected thin materials. Therefore, there is a need for a director inhibitor compound that can work with a range of thin film materials in conjunction with atomic layer deposition processes.

SUMMARY OF THE INVENTION

The present invention relates to director inhibitor materials for use with atomic layer deposition. Such a process for forming a patterned thin film comprises:

(a) providing a substrate;

(b) applying or introducing a composition comprising a deposition inhibitor material comprising an organosiloxane polymer, which may optionally be crosslinked on the substrate;

(c) patterning the deposition inhibitor material either after step (b) or simultaneously with applying the deposition inhibitor material to provide selected areas effectively not having the deposition inhibitor material; and (d) depositing an inorganic thin film on the substrate by atomic layer deposition;

wherein the inorganic thin film material is substantially deposited only in the selected areas of the substrate not having the deposition inhibitor material.

In one embodiment of the process, the deposition inhibitor material is applied in a composition to the surface of the substrate and patterned by depositing a uniform layer of deposition inhibitor material and subsequently patterning the layer. In another embodiment, the deposition inhibitor material is pattern-wise deposited on the substrate.

It is an advantage of the present invention that selective deposition of metal oxides and other materials can be used in a process combined with an ALD system, preferably a spatially dependent ALD system.

It is yet a further advantage of the present invention that it is adaptable for deposition on a web or other moving substrate, including deposition onto a large area substrate.

It is a further advantage of the present invention that it allows operation, in preferred embodiments, under atmospheric pressure conditions.

It is still a further advantage of the present invention that it can be employed in low temperature processes at atmospheric pressures, which process may be practiced in an unsealed environment, open to ambient atmosphere.

The objects, features, and advantages of the present invention will become apparent to those skilled in the art upon a reading of the following detailed description when taken in conjunction with the drawings wherein there is shown and described an illustrative embodiment of the invention.

BRIEF DESCRIPTION OF THE DRAWINGS

While the specification concludes with claims particularly pointing out and distinctly claiming the subject matter of the present invention, it is believed that the invention will be better understood from the following description when taken in conjunction with the accompanying drawings, wherein:

FIGS. 6A and 6B are cross-sectional side views of one embodiment of the distribution of a system of gaseous materials, schematically showing the accompanying deposition operation;

FIGS. 8A and 8B are cross-sectional views taken orthogonally to the cross-sectional views of previous FIGS. 4-6B, showing gas flow directions for output channels in various embodiments;

DETAILED DESCRIPTION OF THE INVENTION

Figure 1:
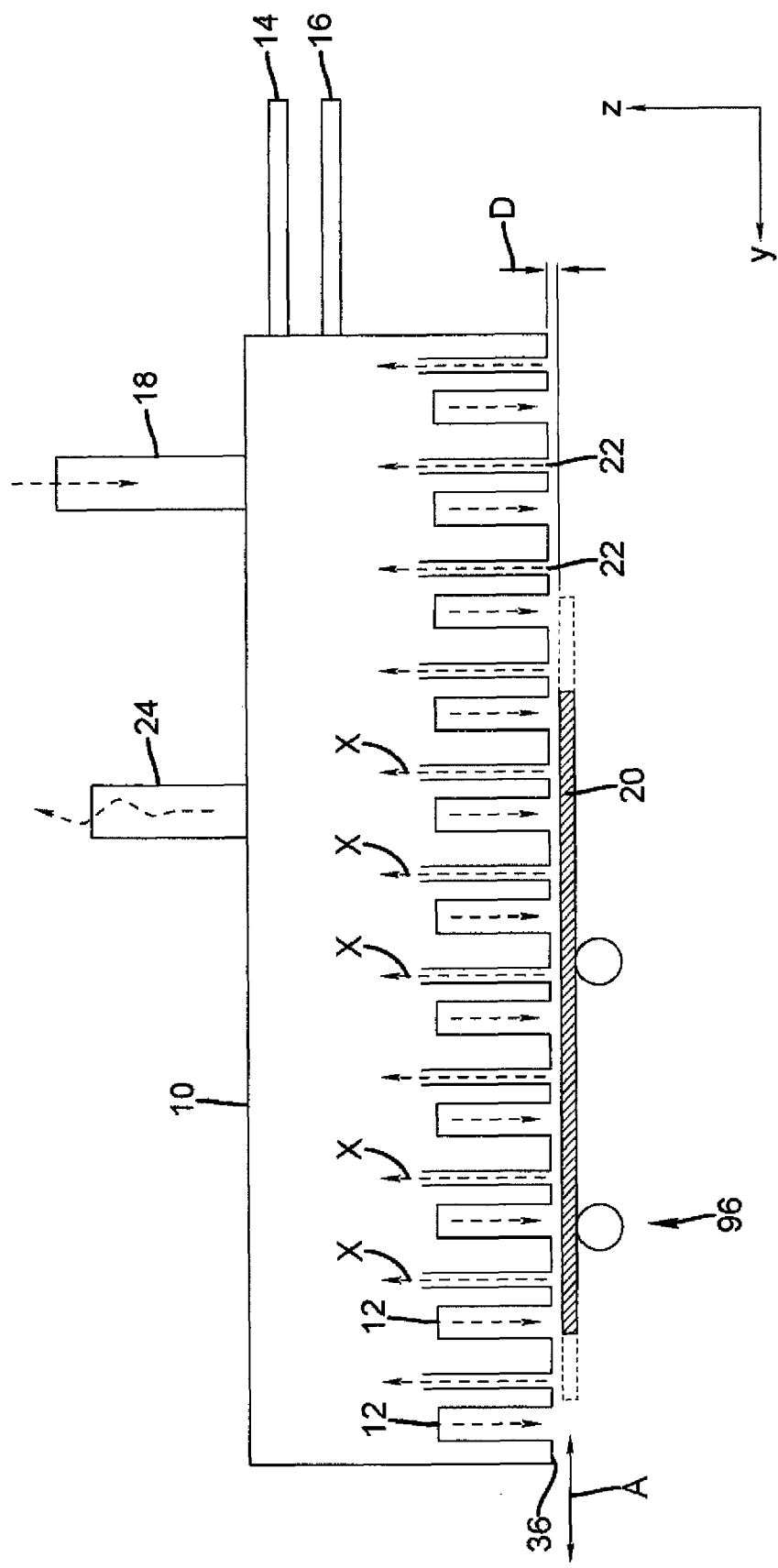
FIG. 1 is a cross-sectional side view of a delivery head for atomic layer deposition for one embodiment of the present invention.

The present invention relates to forming patterned thin films using selective area deposition (SAD). The deposition method of the thin film is atomic layer deposition (ALD). ALD processes should be understood from the background section, and additional process details are presented below. Selected area deposition, as noted above involves treating portion(s) of a substrate such that a material is deposited only in those areas that are desired, or selected. The present invention employs a deposition inhibitor material which inhibits the deposition of the thin films on its surface. In this manner, portions of the substrate where there is a deposition inhibitor material will have little to no thin film growth, and in areas of the substrate which are generally free of the inhibitor material will have thin film growth.

The present invention is directed to the use, as a deposition inhibitor material, of organosiloxanes. The organosiloxanes are defined generically to include compounds substantially comprising, within their chemical structure, a skeleton or moiety made up of alternate Si and O atoms, in which at least one, preferably two organic groups are attached to the Si atom on either side of the —O—Si—O— repeat units. The organic groups can have various substituents such as halogens, including fluorine. Most preferably, the organic groups are independently substituted or unsubstituted alkyl, phenyl, or cycloalkyl groups having 1 to 6 carbon atoms, preferably 1 to 3 carbon atoms, preferably substituted or unsubstituted methyl.

Organosiloxane polymers are defined to include polymers, prepolymers, or macro monomers having at least 20 siloxane repeat units. Particularly preferred are deposition inhibitor materials that, after application onto the substrate, and any cross linking or intermolecular reaction, are insoluble. Such organosiloxane polymers include random or block and/or crosslinked polymers. Cross linking can be used to insolubilize the organosiloxane polymer after application onto the surface of the substrate. The cross linking can occur prior to patterning or may occur during patterning in order to contribute to the patterning step, for example, by employing cross linking initiated by, and patterned by, actinic radiation, followed by removal of non-crosslinked polymer, for example, by solvent.

Optionally, functional groups may be present on the organosiloxane polymer such as terminal groups (also referred to as endcaps). Cross linking groups, and/or functional groups may also be present, for example, located on a side chain off a siloxane backbone.

Examples or ofganosiloxane polymers include, for example, poly(alkylsiloxane), poly(arylsiloxane), poly(alkylarylsiloxane), and poly(alkyl(aryl)siloxane), optionally having functional groups.

Such functionalized poly(siloxanes) include epoxy-functionalized, carboxyl-functionalized, polyether-functionalized, phenol-functionalized, amino-functionalized, alkoxyfunctionalized, methacryl-functionalized, carbinolfunctionalized, hydroxy-functionalized, vinylfunctionalized, acrylic-functionalized, silane-functionalized, trifluoro-functionalized, or mercapto-functionalized poly(organosiloxanes). Block copolymers can also be employed if containing substantial siloxane repeat units. Such polymers can be prepared as described in numerous patents and publications or are commercially available from, for example, General Electric, Dow Corning, and Petrarch.

The preferred poly(organosiloxane) polymers, including random or block copolymers, comprise organic groups (attached to the silicon atoms) that are independently hydrogen, alkyl having from 1 to 18 carbons, such as methyl, ethyl, propyl, butyl, and the like; an aryl group having 6 to 18 carbons, preferably 6 to 8 carbon atoms, such as phenyl, benzyl, napthyl, and the like; a mercaptoalkyl group having from 1 to 18 carbons, such as mercaptopropyl; an aminoalkyl group having from 1 to 18 carbons, such as aminopropyl or aminoisopropyl; trifluoroalkyl having 1 to 18 carbons, such as trifluoromethyl; or trifluoroaryl having 6 to 18 carbons, such as trifluoromethylphenyl. The preferred weight average molecular weight range for the poly(organosiloxane) polymers, if not crosslinked, is 200 to 140,000, more preferably 4,000 to 120,000. Preferably, alkyl groups have 1 to 6 carbon atoms, more preferably 1 to 3 carbon atoms.

The phrase "deposition inhibitor material" refers herein to the material applied to the substrate as well as the material resulting from any optionally subsequent cross linking or other reaction that modifies the material that may occur prior to depositing an inorganic thin film on the substrate by atomic layer deposition.

Some preferred illustrative poly(organosiloxane) polymers (or substantial portions thereof) are poly(dimethylsiloxane), poly(diphenylsiloxane), poly(methylphenylsiloxane), poly(dimethyldiphenylsiloxane), mercaptopropyl-functionalized poly(dimethylsiloxane), aminopropyl-functionalized poly(dimethylsiloxane), carboxypropyl-functionalized poly(dimethylsiloxane), silane-functionalized poly(dimethylsiloxane), and trifluoropropyl-functionalized poly(dimethylsiloxane). More preferred poly(organosiloxane) polymers are poly(dimethylsiloxane) (PDMS) and poly(dimethyldiphenylsiloxane), that is, where the organic groups are appropriately methyl or phenyl. Mixtures of poly(organosiloxane) polymers or compounds can be used. As indicated below, the organosiloxane can be mixed with other polymers as appropriate to the task.

Organosiloxanes for use in selected area deposition (SAD), unlike other deposition inhibitor materials, can provide near zero growth of the thin film on the inhibitor surface. This property greatly enhances the usefulness of the deposition inhibitor material, since it enables a thin film to be selectively deposited that is of a much greater thickness than those previously capable of being deposited in SAD processes.

The process of making the patterned thin film the present invention can be carried out below a maximum support temperature of about 300° C., more preferably below 250° C., or even at temperatures around room temperature (about 25° C. to 70° C.). The temperature selection generally depends on the support and processing parameters known in the art, once one is armed with the knowledge of the present invention contained herein. These temperatures are well below traditional integrated circuit and semiconductor processing temperatures, which enables the use of any of a variety of relatively inexpensive supports, such as flexible polymeric supports. Thus, the invention enables production of relatively inexpensive circuits containing thin film transistors with significantly improved performance.

For the description that follows, the term "gas" or "gaseous material" is used in a broad sense to encompass any of a range of vaporized or gaseous elements, compounds, or materials. Other terms used herein, such as: reactant, precursor, vacuum, and inert gas, for example, all have their conventional meanings as would be well understood by those skilled in the materials deposition art. The figures provided are not drawn to scale but are intended to show overall function and the structural arrangement of some embodiments of the present invention.

In one preferred embodiment, the present process offers a significant departure from conventional approaches to making thin films employing a system for delivery of gaseous materials to a substrate surface that can be adaptable to deposition on larger and web-based substrates and capable of achieving a highly uniform thin film deposition at improved throughput speeds. This preferred process optionally employs a continuous spatially dependent ALD (as opposed to pulsed or time dependent ALD) gaseous material distribution. The process of the present invention optionally allows operation at atmospheric or near-atmospheric pressures and is capable of operating in an unsealed or open-air environment. The process of the present invention is adapted such that material is deposited only in selected areas of a substrate.

Atomic layer deposition can be used to deposit a variety of inorganic thin films that are metals or that comprise a metal-containing compound. Such metal-containing compounds include, for example (with respect to the Periodic Table) a Group V or Group VI anion. Such metal-containing compound can, for example, include oxides, nitrides, sulfides or phosphides of zinc, aluminum, titanium, hafnium, zirconium or indium, or combinations thereof. Metals include, for example, copper, tungsten, aluminum, nickel, ruthenium, or rhodium.

Referring to FIG. 1, a cross-sectional side view of one embodiment of a delivery head 10 for atomic layer deposition onto a substrate 20 according to the present invention is shown. Delivery head 10 has a gas inlet conduit 14 that serves as an inlet port for accepting a first gaseous material, a gas inlet conduit 16 for an inlet port that accepts a second gaseous material, and a gas inlet conduit 18 for an inlet port that accepts a third gaseous material. These gases are emitted at an output face 36 via output channels 12, having a structural arrangement that may include a diffuser, as described subsequently. The dashed line arrows in FIG. 1 refer to the delivery of gases to substrate 20 from delivery head 10. In FIG. 1, dotted line arrows X also indicate paths for gas exhaust (shown directed upwards in this figure) and exhaust channels 22, in communication with an exhaust conduit 24 that provides an exhaust port. Since the exhaust gases may still contain quantities of unreacted precursors, it may be undesirable to allow an exhaust flow predominantly containing one reactive species to mix with one predominantly containing another species. As such, it is recognized that the delivery head 10 may contain several independent exhaust ports.

In one embodiment, gas inlet conduits 14 and 16 are adapted to accept first and second gases that react sequentially on the substrate surface to effect ALD deposition, and gas inlet conduit 18 receives a purge gas that is inert with respect to the first and second gases. Delivery head 10 is spaced a distance D from substrate 20, which may be provided on a substrate support, as described in more detail subsequently. Reciprocating motion can be provided between substrate 20 and delivery head 10, either by movement of substrate 20, by movement of delivery head 10, or by movement of both substrate 20 and delivery head 10. In the particular embodiment shown in FIG. 1, substrate 20 is moved by a substrate support 96 across output face 36 in reciprocating fashion, as indicated by the arrow A and by phantom outlines to the right and left of substrate. It should be noted that reciprocating motion is not always required for thin-film deposition using delivery head 10. Other types of relative motion between substrate 20 and delivery head 10 could also be provided, such as movement of either substrate 20 or delivery head 10 in one or more directions.

Figure 2:
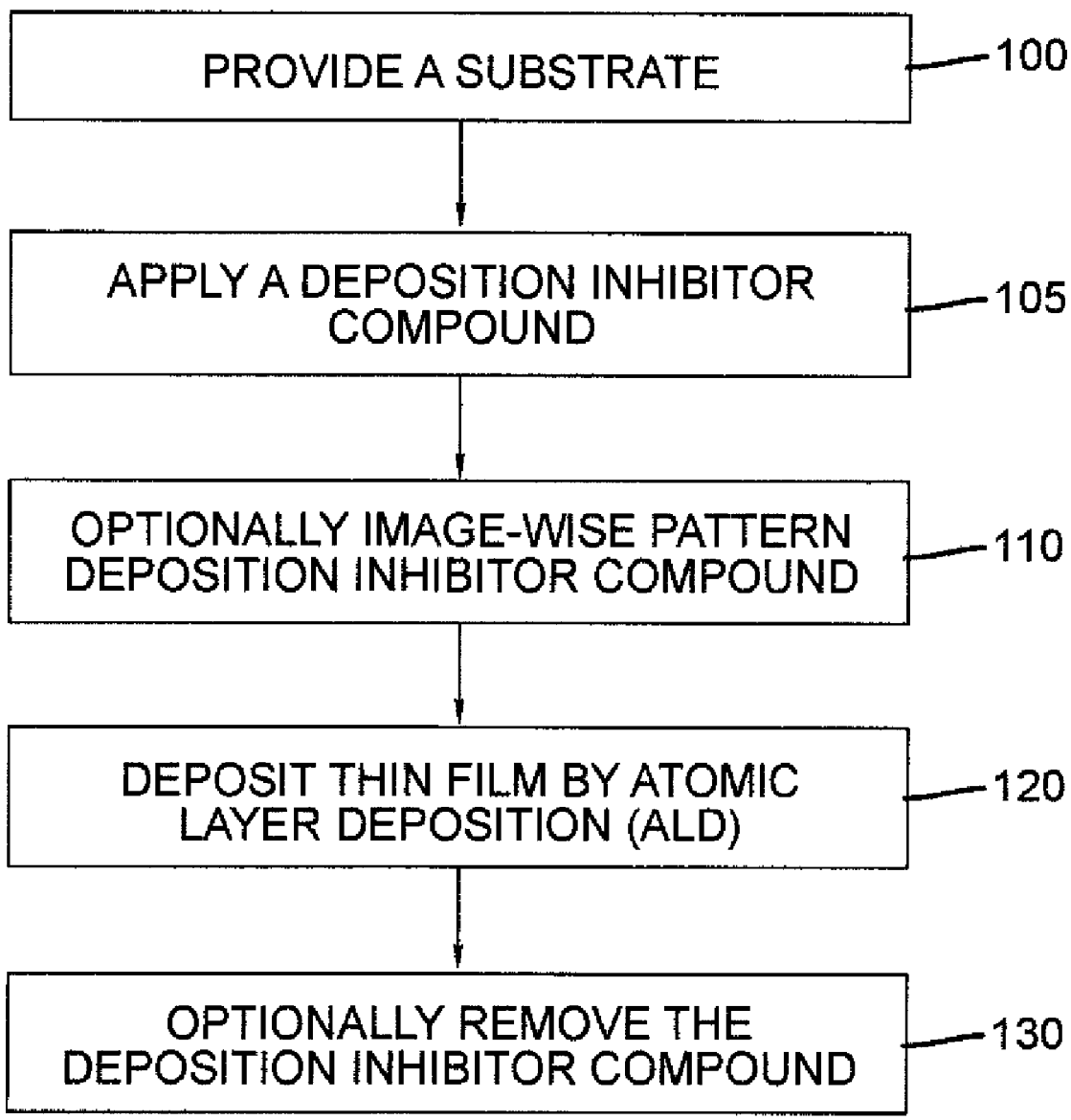
FIG. 2 is a flow chart describing one embodiment of the steps of the present process.

FIG. 2 is a step diagram for one embodiment of a process of the present invention for making a patterned thin film using a combination of selected area deposition (SAD) and ALD. As shown in Step 100, a substrate is supplied into the system. In Step 105 a deposition inhibitor material is deposited. The deposition inhibitor material can generically be any material that causes the material deposition to be inhibited. In one embodiment, the deposition inhibitor material is chosen specifically for the material to be deposited. In other embodiments, the deposition inhibitor material has a given inhibition power; the inhibition power is defined as the layer thickness at or below which the deposition inhibitor material is effective. The deposition of the deposition inhibitor material in Step 105 can be in a patterned manner, such as using inkjet, flexography, gravure printing, micro contact printing, offset lithography, patch coating, screen printing, or donor transfer. In an alternative embodiment, Step 105 can deposit a uniform layer of the deposition inhibitor material and Step 110 can be optionally employed to form a patterned layer of the deposition inhibitor material.

Continuing with FIG. 2, Step 120 deposits the desired thin film by an Atomic Layer Deposition (ALD) process. Generically this deposition can use any suitable ALD equipment, preferably with a spatially dependent ALD system. The thin film is deposited only in the areas of the substrate where there is no deposition inhibitor material. Depending on the use of the thin film, the deposition inhibitor material may remain on the substrate for subsequent processing or may be removed as shown in Step 130 of FIG. 2.

Figure 3:
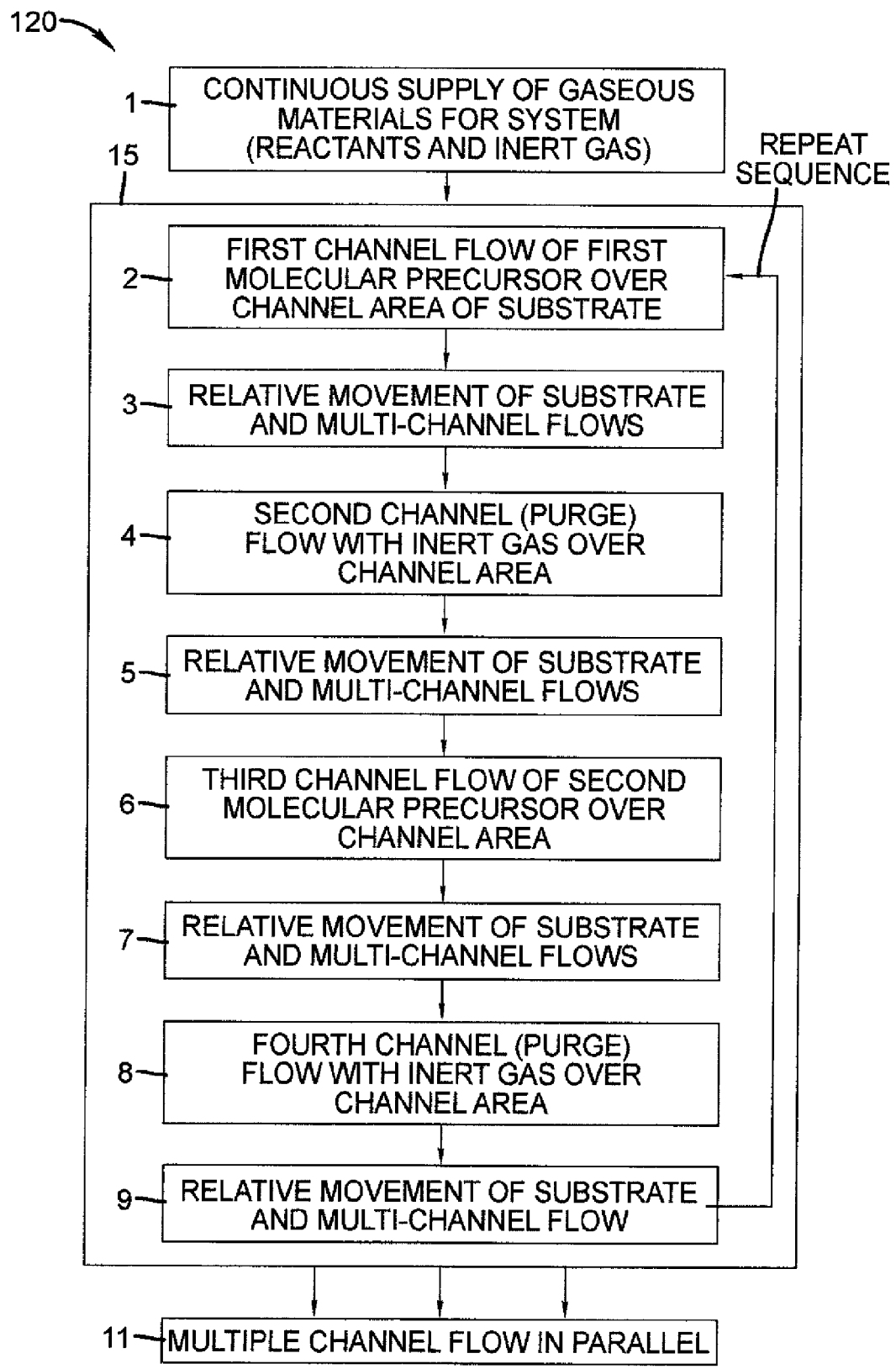
FIG. 3 is a flow chart describing the steps for an ALD process for use in the present invention.

FIG. 3 is a step diagram of a preferred embodiment of an ALD process 120 for making the thin film, in which two reactive gases are used, a first molecular precursor and a second molecular precursor. Gases are supplied from a gas source and can be delivered to the substrate, for example, via a deposition device. Metering and valving apparatus for providing gaseous materials to the deposition device can be used.

As shown in Step 1, a continuous supply of gaseous materials for the process is provided for depositing a thin film of material on a substrate. The Steps in Sequence 15 are sequentially applied. In Step 2, with respect to a given area of the substrate (referred to as the channel area), a first molecular precursor or reactive gaseous material is directed to flow in a first channel over the channel area of the substrate and reacts therewith. In Step 3 relative movement of the substrate and the multi-channel flows in the system occurs, which sets the stage for Step 4, in which second channel (purge) flow with inert gas occurs over the given channel area. Then, in Step 5, relative movement of the substrate and the multi-channel flows sets the stage for Step 6, in which the given channel area is subjected to atomic layer deposition in which a second molecular precursor now over the given channel area of the substrate and reacts with the previous layer on the substrate to produce (theoretically) a monolayer of a desired material. A first molecular precursor is in gas form, for example, an organ metallic compound such as diethylzinc or trimethyl-aluminum. In such an embodiment, the second molecular precursor is also in gaseous form and can be, for example, a non-metallic oxidizing compound. The process of deposition can comprise flows of gaseous materials that are orthogonal towards the substrate, transverse across the face of the substrate, or some combination of both types of flows. Preferably, the channels comprise or are connected to a series of corresponding substantially parallel elongated openings in the output face of at least one delivery head for thin film deposition. More than one delivery head may be employed for deposition of one or more thin films.

In Step 7, relative movement of the substrate and the multi-channel flows then sets the stage for Step 8 in which again an inert gas is used, this time to sweep excess second molecular precursor from the given channel area from the previous Step 6. In Step 9, relative movement of the substrate and the multi-channels occurs again, which sets the stage for a repeat sequence, back to Step 2. The cycle is repeated as many times as is necessary to establish a desired film. In the present embodiment of the process, the steps are repeated with respect to a given channel area of the substrate, corresponding to the area covered by a flow channel. Meanwhile the various channels are being supplied with the necessary gaseous materials in Step 1. Simultaneous with the sequence of box 15 in FIG. 1, other adjacent channel areas are being processed, which results in multiple channel flows in parallel, as indicated in overall Step 11. As indicated above, parallel flow can be either substantially orthogonal or substantially parallel to the output face of the deposition device.

The primary purpose of the second molecular precursor is to condition the substrate surface back toward reactivity with the first molecular precursor. The second molecular precursor also provides material from the molecular gas to combine with metal at the surface, forming an oxide with the freshly deposited zinc-containing precursor.

This particular embodiment does not need to use a vacuum purge to remove a molecular precursor after applying it to the substrate. Purge steps are expected by most researchers to be the most significant throughput-limiting step in ALD processes.

Assuming that, for the two reactant gases in FIG. 3, AX and BY are used, for example. When the reaction gas AX flow is supplied and flowed over a given substrate area, atoms of the reaction gas AX are chemically adsorbed on a substrate, resulting in a layer of A and a surface of ligand X (associative chemisorptions) (Step 2). Then, the remaining reaction gas AX is purged with an inert gas (Step 4). Then, the flow of reaction gas BY, and a chemical reaction between AX (surface) and BY (gas) occurs, resulting in a molecular layer of AB on the substrate (dissociative chemisorptions) (Step 6). The remaining gas BY and by-products of the reaction are purged (Step 8). The thickness of the thin film may be increased by repeating the process cycle (steps 2-9) many times.

Because the film can be deposited one monolayer at a time it tends to be conformal and have uniform thickness.

Oxides that can be made using the process of the present invention include, but are not limited to: zinc oxide (ZnO), aluminum oxide ($Al_2O_3$), hafnium oxide, zirconium oxide, indium oxide, tin oxide, and the like. Mixed structure oxides that can be made using the process of the present invention can include, for example, InZnO. Doped materials that can be made using the process of the present invention can include, for example, ZnO:Al, $Mg_xZn_{1-x}O$, and LiZnO.

Metals that can be made using the process of the present invention include, but are not limited to: copper, tungsten, aluminum, nickel, ruthenium, and/or rhodium. It will be apparent to the skilled artisan that alloys of two, three, or more metals may be deposited, compounds may be deposited with two, three, or more constituents, and such things as graded films and nano-laminates may be produced as well.

These variations are simply variants using particular embodiments of the invention in alternating cycles. There are many other variations within the spirit and scope of the invention, so the invention is limited only by the claims that follow.

For various volatile zinc-containing precursors, precursor combinations, and reactants useful in ALD thin film processes, reference is made to the Handbook of *Thin Film Process Technology*, Vol. 1, edited by Glocker and Shah, Institute of Physics (IOP) Publishing, Philadelphia 1995, pages B1.5:1 to B1.5:16, hereby incorporated by reference; and *Handbook of Thin Film Materials*, edited by Nalwa, Vol. 1, pages 103 to 159, hereby incorporated by reference, including Table V1.5.1 of the former reference.

Although oxide substrates provide groups for ALD deposition, plastic substrates can be used by suitable surface treatment.

Figure 4:
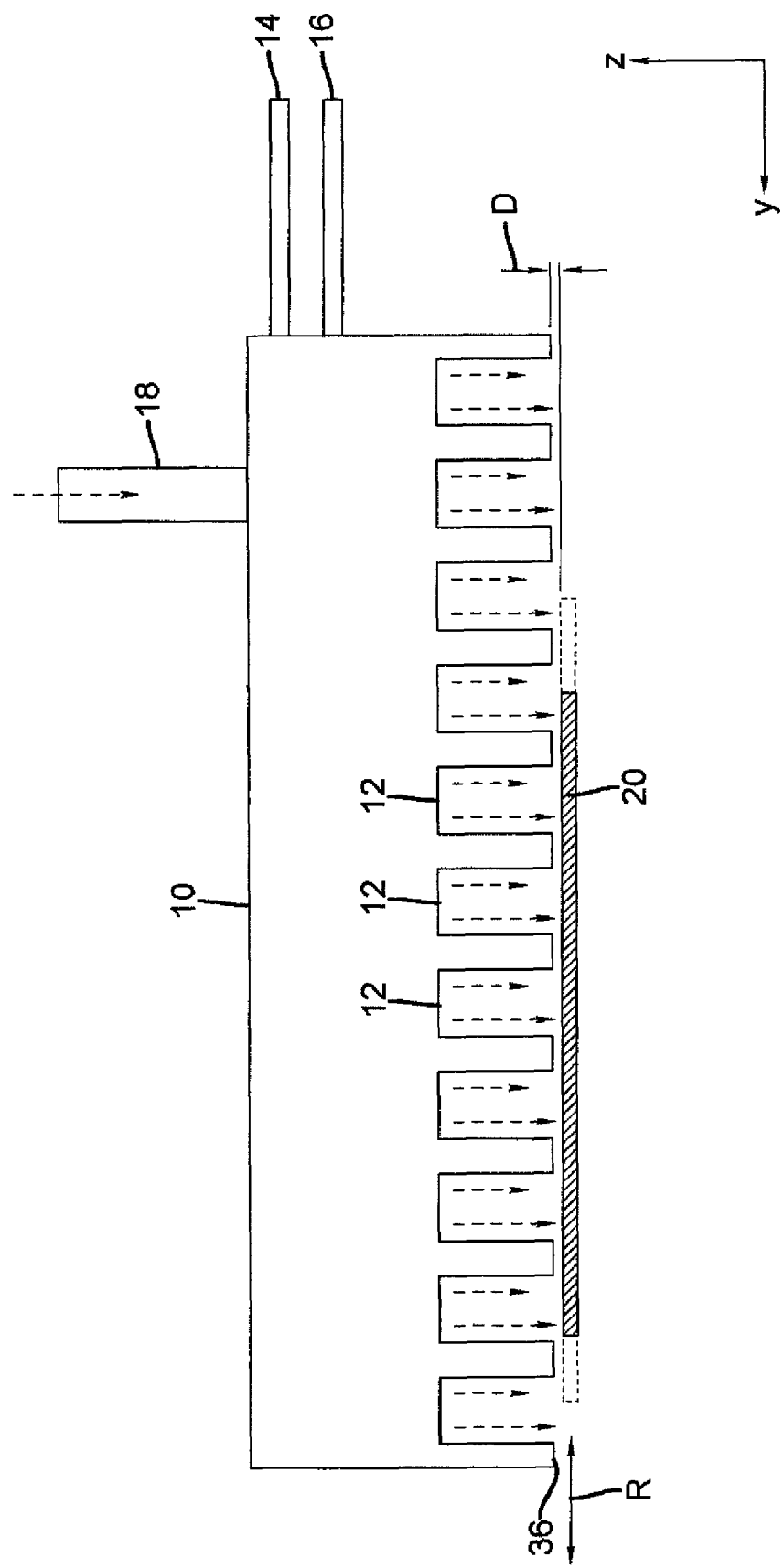
FIG. 4 is a cross-sectional side view of one embodiment of a deposition device for atomic layer deposition that can be used in the present process.

Referring now to FIG. 4, there is shown a cross-sectional side view of one embodiment of a delivery head 10 that can be used in the present process for atomic layer deposition onto a substrate 20 according to the present invention. Delivery head 10 has a gas inlet port 14 for accepting a first gaseous material, a gas inlet port 16 for accepting a second gaseous material, and a gas inlet port 18 for accepting a third gaseous material. These gases are emitted at an output face 36 via output channels 12, having a structural arrangement described subsequently. The arrows in FIG. 4 and subsequent FIGS. 6A and 6B refer to the diffusive transport of the gaseous material, and not the flow, received from an output channel. In this particular embodiment, the flow is substantially directed out of the page of the figure, as described further below.

In one embodiment, gas inlet ports 14 and 16 are adapted to accept first and second gases that react sequentially on the substrate surface to effect ALD deposition, and gas inlet port 18 receives a purge gas that is inert with respect to the first and second gases. Delivery head 10 is spaced a distance D from substrate 20, provided on a substrate support, as described in more detail subsequently. Reciprocating motion can be provided between substrate 20 and delivery head 10, either by movement of substrate 20, by movement of delivery head 10, or by movement of both substrate 20 and delivery head 10. In the particular embodiment shown in FIG. 4, substrate 20 is moved across output face 36 in reciprocating fashion, as indicated by the arrow R and by phantom outlines to the right and left of substrate 20 in FIG. 4. It should be noted that reciprocating motion is not always required for thin-film deposition using delivery head 10. Other types of relative motion between substrate 20 and delivery head 10 could also be provided, such as movement of either substrate 20 or delivery head 10 in one or more directions, as described in more detail subsequently.

Figure 5:
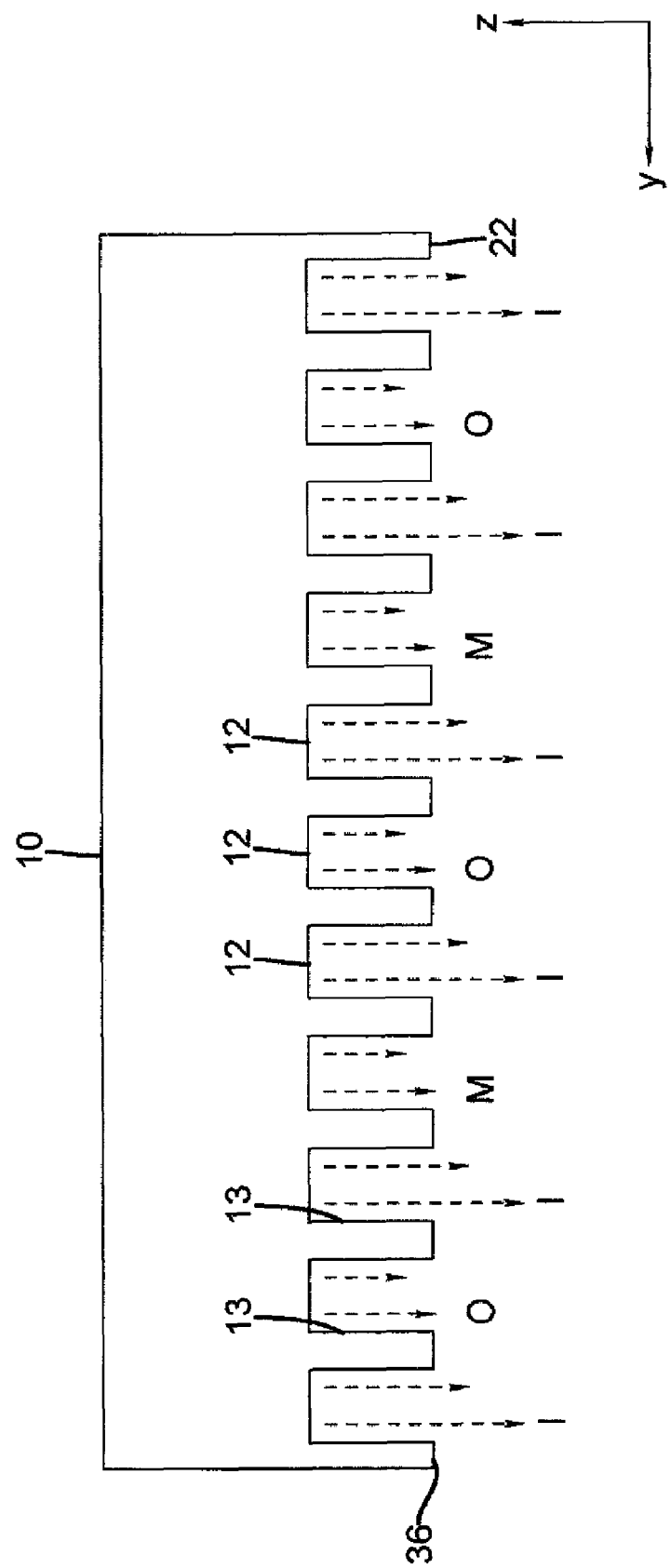
FIG. 5 is a cross-sectional side view of an embodiment, for one exemplary system of gaseous materials, of the distribution of gaseous materials to a substrate that is subject to thin film deposition.

The cross-sectional view of FIG. 5 shows gas flows emitted over a portion of output face 36 of delivery head 10. In this particular arrangement, each output channel 12, separated by partitions 13, is in gaseous flow communication with one of gas inlet ports 14, 16 or 18 seen in FIG. 4. Each output channel 12 delivers typically a first reactant gaseous material O, or a second reactant gaseous material M, or a third inert gaseous material I.

FIG. 5 shows a relatively basic or simple arrangement of gases. It is envisioned that a plurality of non-metal deposition precursors (like material O) or a plurality of metal-containing precursor materials (like material M) may be delivered sequentially at various ports in a thin-film single deposition. Alternately, a mixture of reactant gases, for example, a mixture of metal precursor materials or a mixture of metal and non-metal precursors may be applied at a single output channel when making complex thin film materials, for example, having alternate layers of metals or having lesser amounts of dopants admixed in a metal oxide material. The inter-stream labeled I separates any reactant channels in which the gases are likely to react with each other. First and second reactant gaseous materials O and M react with each other to effect ALD deposition, but neither reactant gaseous material O nor M reacts with inert gaseous material I. The nomenclature used in FIG. 5 and following suggests some typical types of reactant gases. For example, first reactant gaseous material O could be an oxidizing gaseous material; second reactant gaseous material M could be an organo-metallic compound. In an alternative embodiment, O may represent a nitrogen or sulfur containing gaseous material for forming nitrides and sulfides. Inert gaseous material I could be nitrogen, argon, helium, or other gases commonly used as purge gases in ALD processes. Inert gaseous material I is inert with respect to first or second reactant gaseous materials O and M. Reaction between first and second reactant gaseous materials would form a metal oxide or other binary compound, such as zinc oxide ZnO, in one embodiment. Reactions between more than two reactant gaseous materials could form other materials such as a ternary compound, for example, ZnAlO.

Figure 6B:
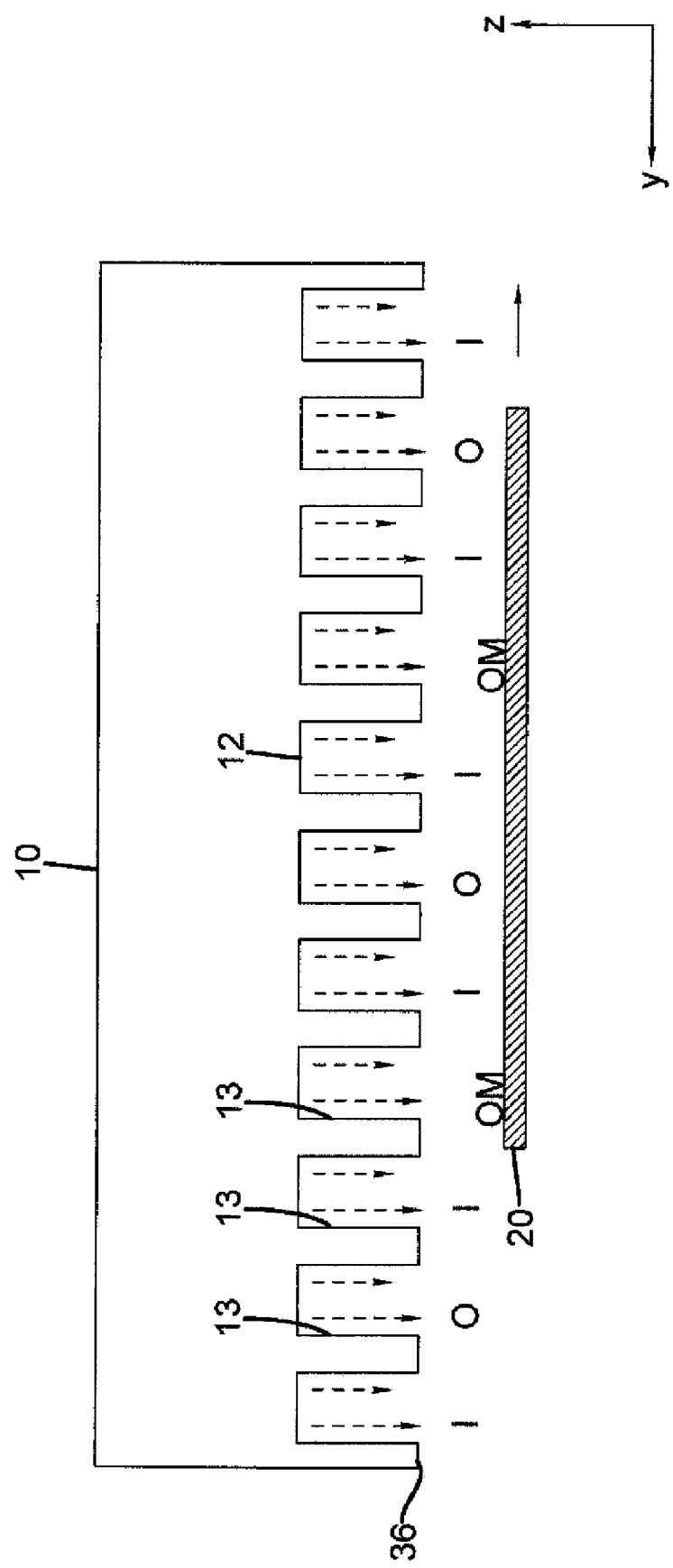

The cross-sectional views of FIGS. 6A and 6B show, in simplified schematic form, the ALD coating operation performed as substrate 20 passes along output face 36 of delivery head 10 when delivering reactant gaseous materials O and M. In FIG. 6A, the surface of substrate 20 first receives an oxidizing material from output channels 12 designated as delivering first reactant gaseous material O. The surface of the substrate now contains a partially reacted form of material O, which is susceptible to reaction with material M. Then, as substrate 20 passes into the path of the metal compound of second reactant gaseous material M, the reaction with M takes place, forming a metallic oxide or some other thin film material that can be formed from two reactant gaseous materials.

As FIGS. 6A and 6B show, inert gaseous material I is provided in every alternate output channel 12, between the flows of first and second reactant gaseous materials O and M. Sequential output channels 12 are adjacent, that is, share a common boundary, formed by partitions 13 in the embodiments shown. Here, output channels 12 are defined and separated from each other by partitions 13 that extend at a perpendicular to the surface of substrate 20.

As mentioned above, in this particular embodiment, there are no vacuum channels interspersed between the output channels 12, that is, no vacuum (exhaust) channels on either side of a channel delivering gaseous materials to draw out the gaseous materials around the partitions. This advantageous, compact arrangement is possible because of the innovative gas flow that is used. Gas delivery arrays, in one embodiment, can apply substantially vertical (that is, perpendicular) gas flows against the substrate, but then must usually draw off spent gases in the opposite vertical direction, so that exhaust openings and channels would be desirable. A delivery head 10 that directs a gas flow (preferably substantially laminar in one embodiment) along the surface for each reactant and inert gas can more easily handle spent gases and reaction by-products in a different manner, as described subsequently. Thus, in one preferred embodiment, the gas flow is directed along and generally parallel to the plane of the substrate surface. In other words, the flow of gases is substantially transverse to the plane of a substrate rather than perpendicular to the substrate being treated.

Figure 7:
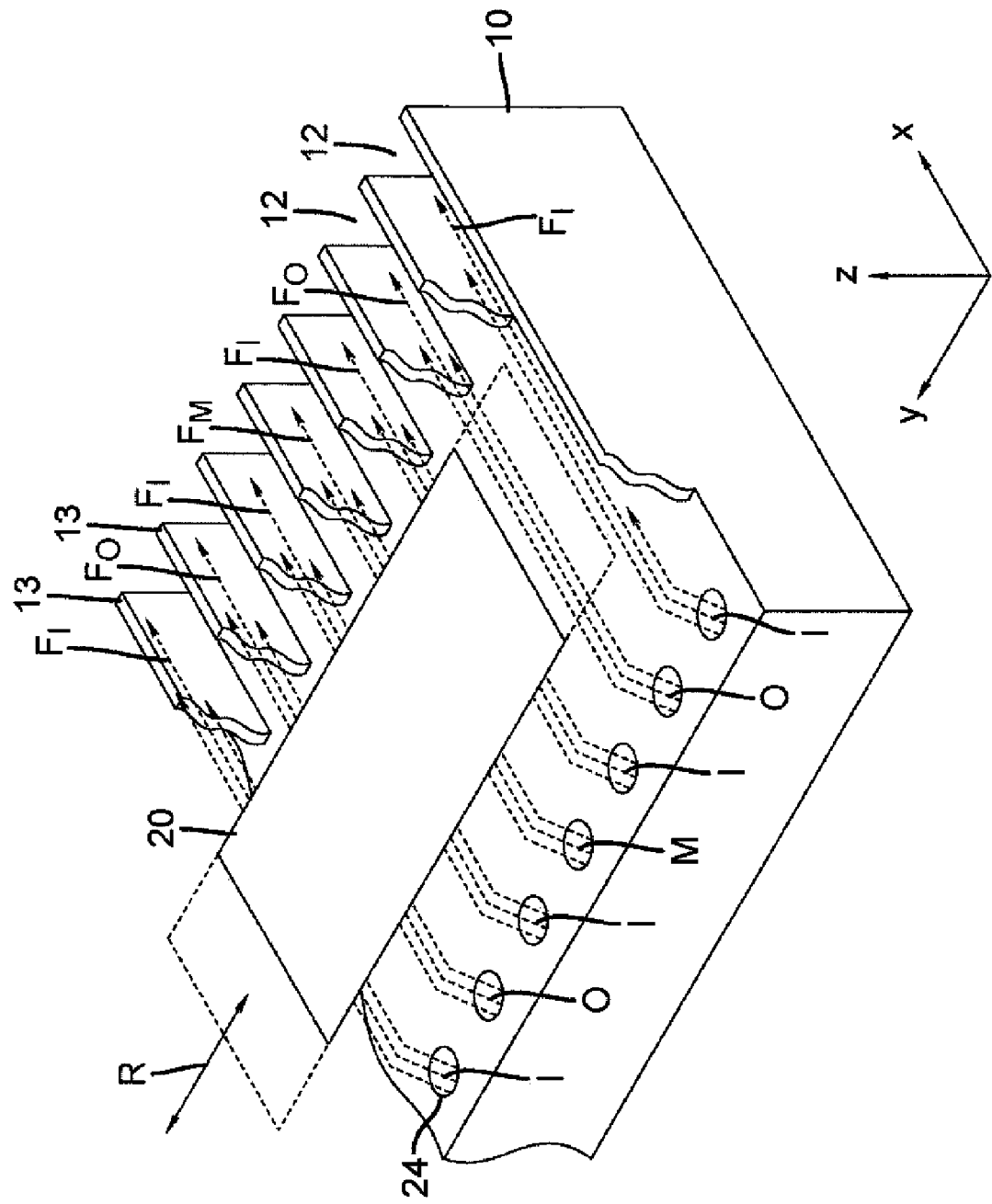
FIG. 7 is a perspective view, from the output face side, of a portion of one embodiment of a deposition device, showing the orientation of output channels relative to the substrate and reciprocating motion, showing one exemplary arrangement of gas flow in the deposition device.

FIG. 7 shows a perspective view of one such embodiment of delivery head 10 that can be used in the present process, from the output face 36 (that is, from the underside with respect to FIGS. 4-6B). Partitions 13 that define and separate the adjacent output channels 12 in this embodiment are represented as partially cut away, to allow better visibility for the gas flows flowing from gas outlet ports 24. FIG. 7 also shows reference x,y,z coordinate axis assignments used in the figures of this disclosure. Output channels 12 are substantially in parallel and extend in a length direction that corresponds to the x coordinate axis. Reciprocating motion of substrate 20, or motion relative to substrate 20, is in the y coordinate direction, using this coordinate assignment.

FIG. 7 shows the gas flows $F_I$, $F_O$, and $F_M$ for the various gaseous materials delivered from delivery head 10 with this embodiment. Gas flows $F_I$, $F_O$, and $F_M$ are in the x-direction, that is, along the length of elongated output channels 12.

The cross-sectional views of FIGS. 8A and 8B are taken orthogonally to the cross-sections of FIGS. 4-6B and show gas flows in one direction from this view. Within each output channel 12, the corresponding gaseous material flows from a gas output port 24, shown in phantom in the views of FIGS. 8A and 8B. In the embodiment of FIG. 8A, gas flow F1 directs the gaseous material along the length of output channel 12 and across substrate 20, as was described with reference to FIG. 7. Flow F1 continues past the edge of delivery head 10 in this arrangement, flowing outward into the environment or, if desirable, to a gas collection manifold (not shown). FIG. 8B shows an alternative embodiment for gas flow F2 in which output channel 12 also provides an exhaust port 26 for redirection or drawing off of the gas flow. Although unidirectional flows are preferred, some degree of mixing can occur and even may be beneficial to some extent, depending on the flow rates and other circumstances involved in a particular application.

A particular delivery head 10 may use output channels 12 configured using any one of the gas flow configurations or combinations thereof, either the F1 flow of FIG. 8A, the F2 flow of FIG. 8B, or some other variation in which gaseous material is directed to flow across substrate 20 along output channel 12, preferably in a substantially laminar or smooth fashion with controlled mixing. In one embodiment, one or more exhaust ports 26 are provided for each output channel 12 that delivers a reactant gaseous material. For example, referring to FIG. 7, output channels 12 for first and second reactant gaseous materials, labeled O and M, are configured with exhaust ports 26 to vent or draw off the reactant substances, following the pattern of flow F2 (FIG. 8B). This allows some recycling of materials and prevents undesirable mixing and reaction near the end of the manifold. Output channels 12 for inert gaseous material, labeled I, do not use exhaust ports 26 and thus follow the pattern of flow F1 (FIG. 8A). Although laminar flows are preferred in some embodiments, some degree of mixing can occur and even may be beneficial to some extent, depending on the flow rates and other circumstances involved in a particular application.

Exhaust port 26 is not a vacuum port, in the conventional sense, but is simply provided to draw off the gaseous flow in its corresponding output channel 12, thus facilitating a uniform gas flow pattern within the channel. A negative draw, just slightly less than the opposite of the gas pressure at gas output port 24, can help to facilitate an orderly gas flow. The negative draw can, for example, operate at a pressure of between 0.9 and 1.0 atmosphere, whereas a typical vacuum is, for example, below 0.1 atmosphere. An optional baffle 58, as shown in dotted outline in FIG. 8B, may be provided to redirect the flow pattern into exhaust port 26.

Because no gas flow around partition 13 to a vacuum exhaust is needed, output face 36 can be positioned very closely, to within about 1 mil (approximately 0.025 mm) of the substrate surface. By comparison, an earlier approach such as that described in the U.S. Pat. No. 6,821,563 to Yudovsky, cited earlier, required gas flow around the edges of channel sidewalls and was thus limited to 0.5 mm or greater distance to the substrate surface. Positioning the delivery head 10 closer to the substrate surface is preferred in the present invention. In a preferred embodiment, distance D from the surface of the substrate can be 0.4 mm or less, preferably within 0.3 mm, more preferably within 0.25 mm of the output face of the deposition device or the bottom of the guide walls that provide the flow channels.

In order to provide smooth flow along the length of output channel 12, gas output port 24 may be inclined at an angle away from normal, as indicated in FIGS. 8A and 8B. Optionally, some type of gas flow redirecting structure may also be employed to redirect a downward flow from gas output port 24 so that it forms a gas flow that runs substantially in parallel to output face 36.

As was particularly described with reference to FIGS. 6A and 6B, delivery head 10 requires movement relative to the surface of substrate 20 in order to perform its deposition function. This relative movement can be obtained in a number of ways, including movement of either or both delivery head 10 and substrate 20, such as by movement of a process that provides a substrate support. Movement can be oscillating or reciprocating or could be continuous movement, depending on how many deposition cycles are needed. Rotation of a substrate can also be used, particularly in a batch process, although continuous processes are preferred.

Typically, ALD requires multiple deposition cycles, building up a controlled film depth with each cycle. Using the nomenclature for types of gaseous materials given earlier, a single cycle can, for example in a simple design, provide one application of first reactant gaseous material O and one application of second reactant gaseous material M.

The distance between output channels for 0 and M reactant gaseous materials determines the needed distance for reciprocating movement to complete each cycle. For an example, delivery head 10, having a nominal channel width of 0.034 inches in width W for each output channel 12, reciprocating motion (along the y axis as used herein) of at least 0.20 inches would be required. For this example, an area of substrate 20 would be exposed to both first reactant gaseous material O and second reactant gaseous material M with movement over this distance. In some cases, consideration for uniformity may require a measure of randomness to the amount of reciprocating motion in each cycle, such as to reduce edge effects or build-up along the extremes of reciprocation travel.

A delivery head 10 may have only enough output channels 12 to provide a single cycle. Alternately, delivery head 10 may have an arrangement of multiple cycles, enabling it to cover a larger deposition area or enabling its reciprocating motion over a distance that allows two or more deposition cycles in one traversal of the reciprocating motion distance.

In one embodiment, a given area of the substrate is exposed to a gas flow in a channel for less than 500 milliseconds, preferably less than 100 milliseconds. The relative movement of the substrate to a channel during oscillation is at a speed at least 0.1 cm/sec, and the gas flow in the channels is at least 1 cm/sec. Preferably, the temperature of the substrate during deposition is under 300° C., more preferably under 250° C.

For example, in one particular application, it was found that each O-M cycle formed a layer of one atomic diameter over about ¼ of the treated surface. Thus, four cycles, in this case, are needed to form a uniform layer of 1 atomic diameter over the treated surface. Similarly, to form a uniform layer of 10 atomic diameters in this case, then, 40 cycles would be required.

Figure 9:
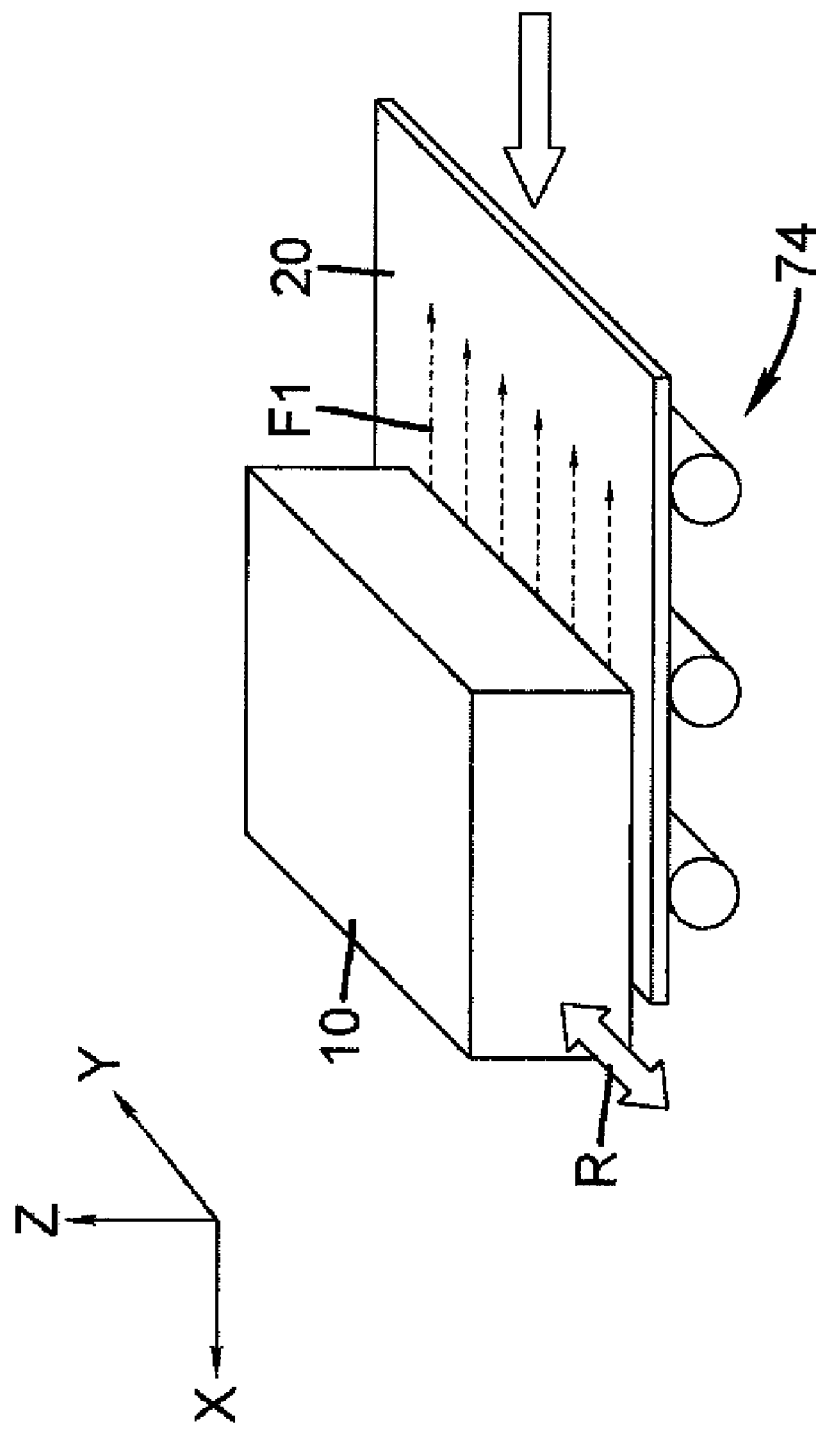
FIG. 9 is a schematic diagram showing an alternative motion pattern for reciprocating and orthogonal movement.

An advantage of the reciprocating motion used for a delivery head 10 used in one embodiment of the present process is that it allows deposition onto a substrate 20 whose area exceeds the area of output face 36. FIG. 9 schematically shows how this broader area coverage can be effected, using reciprocating motion along the y axis as shown by arrow R and also movement orthogonal or transverse to the reciprocating motion, relative to the x axis. Again, it must be emphasized that motion in either the x or y direction, as shown in FIG. 9, can be effected either by movement of delivery head 10, or by movement of substrate 20 provided with a substrate support 74 that provides movement, or by movement of both delivery head 10 and substrate 20.

In FIG. 9 the relative motion of the delivery head 10 and the substrate 20 are perpendicular to each other. It is also possible to have this relative motion in parallel. In this case, the relative motion needs to have a nonzero frequency component that represents the oscillation and a zero frequency component that represents the displacement of the substrate 20. This combination can be achieved by: an oscillation combined with displacement of the delivery head 10 over a fixed substrate; an oscillation combined with displacement of the substrate 20 relative to a fixed substrate delivery head 10; or any combinations wherein the oscillation and fixed motion are provided by movements of both the substrate 20 and the delivery head 10.

In a preferred embodiment, ALD can be performed at or near atmospheric pressure and over a broad range of ambient and substrate temperatures, preferably at a temperature of under 300° C. Preferably, a relatively clean environment is needed to minimize the likelihood of contamination; however, full "clean room" conditions or an inert gas-filled enclosure would not be required for obtaining good performance when using preferred embodiments of the process of the present invention.

Figure 10:
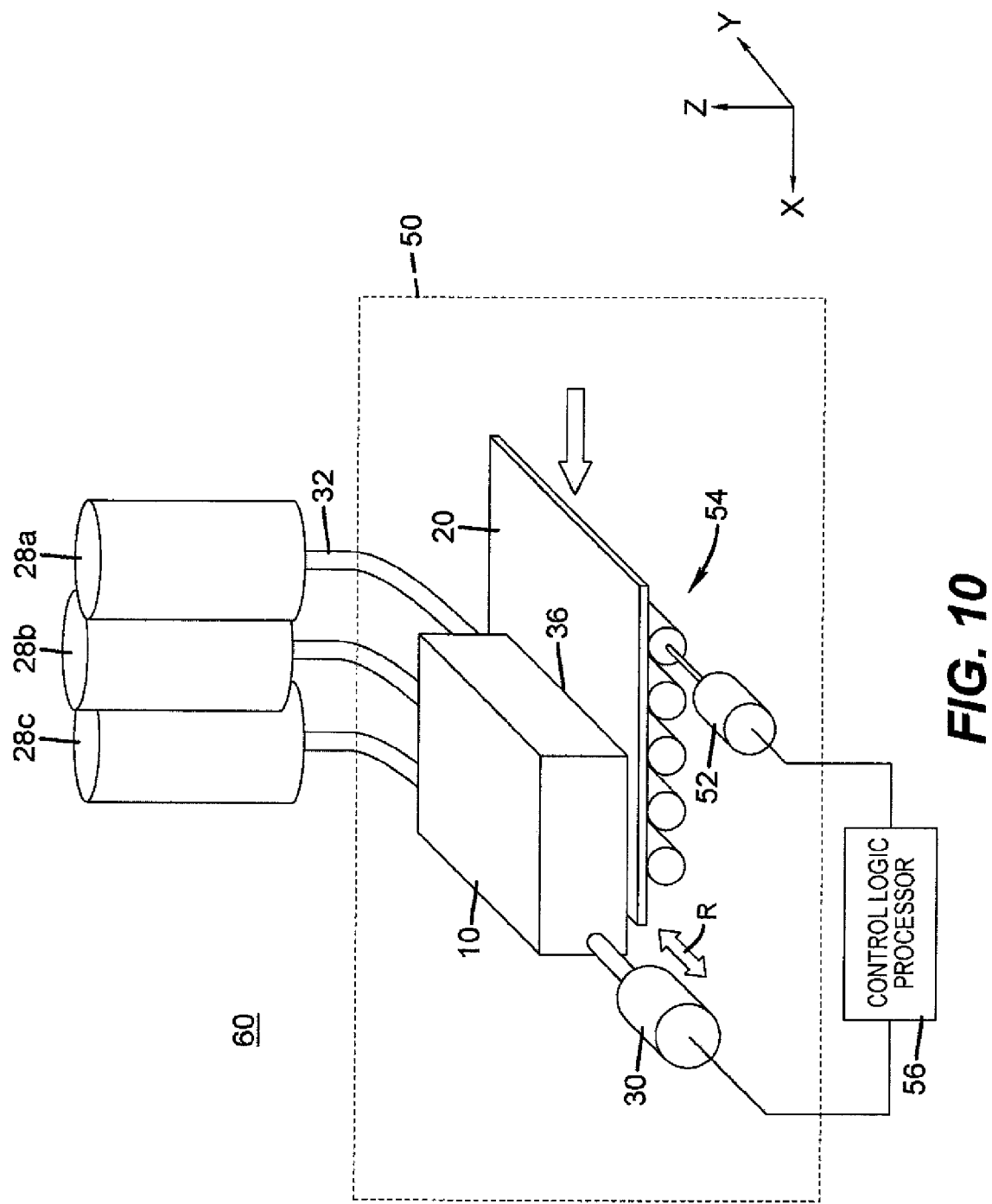
FIG. 10 is a block diagram of one embodiment of a deposition system that uses the process according to the present invention.

FIG. 10 shows an Atomic Layer Deposition (ALD) 60 process, for making a zinc-oxide-based semiconductor, having a chamber 50 for providing a relatively well-controlled and contaminant-free environment. Gas supplies 28a, 28b, and 28c provide the first, second, and third gaseous materials to delivery head 10 through supply lines 32. The optional use of flexible supply lines 32 facilitates ease of movement of delivery head 10. For simplicity, an optional vacuum vapor recovery process and other support components are not shown in FIG. 10 but could also be used. A transport subsystem 54 provides a substrate support that conveys substrate 20 along output face 36 of delivery head 10, providing movement in the x direction, using the coordinate axis system employed in the present disclosure. Motion control, as well as overall control of valves and other supporting components, can be provided by a control logic processor 56, such as a computer or dedicated microprocessor assembly, for example. In the arrangement of FIG. 10, control logic processor 56 controls an actuator 30 for providing reciprocating motion to delivery head 10 and also controls a transport motor 52 of transport subsystem 54.

Figure 11:
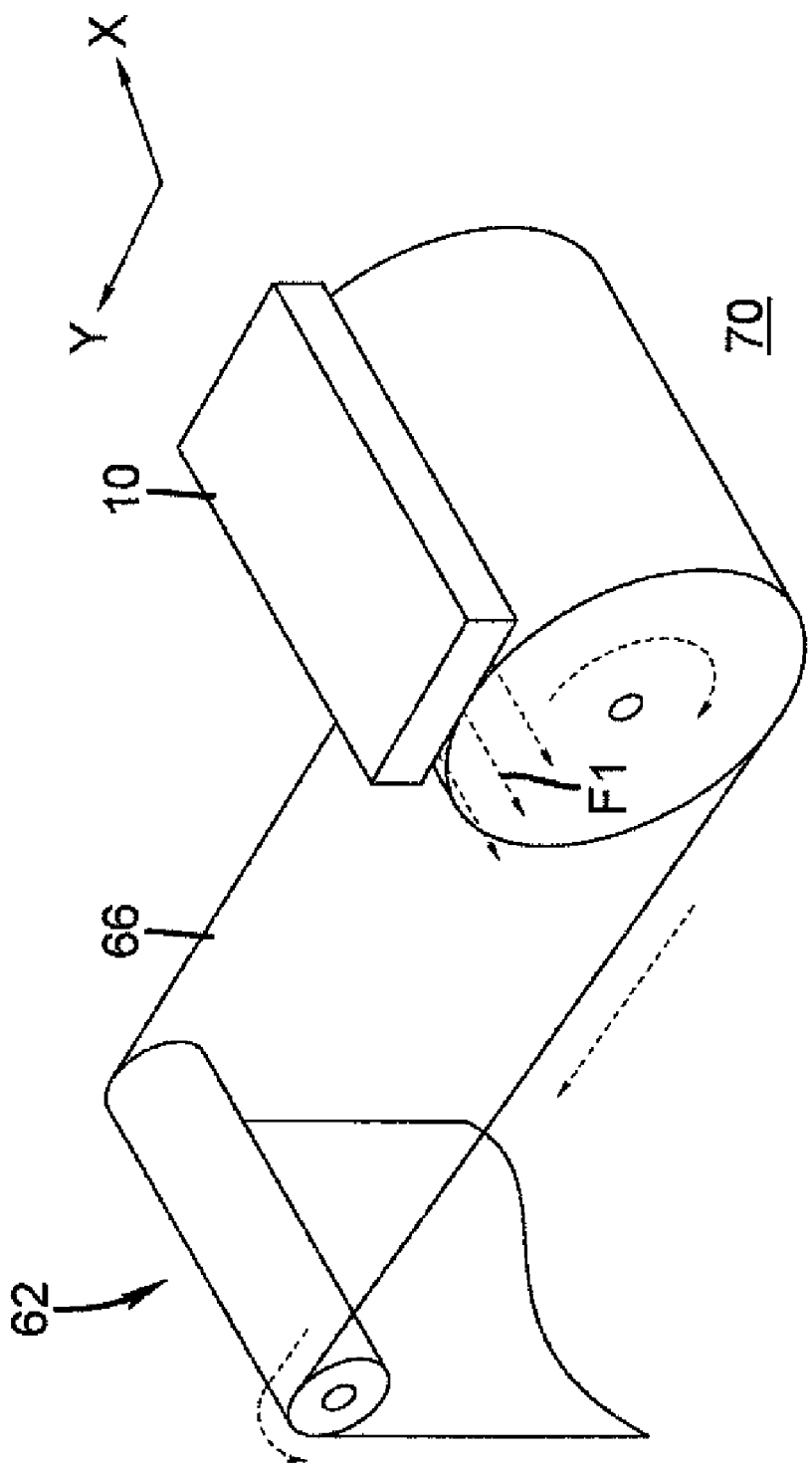
FIG. 11 is a block diagram showing another embodiment of deposition system applied to a moving web in accordance with the present process, with the deposition device stationary.

FIG. 11 shows an Atomic Layer Deposition (ALD) system 70 for depositing a thin film in a web arrangement, using a stationary delivery head 10 in which the flow patterns are oriented orthogonally to the configuration of FIG. 10. In this arrangement, motion of web conveyor 62 itself provides the movement needed for ALD deposition. Reciprocating motion could also be used in this environment, such as by repeatedly reversing the direction of rotation of a web roller to move web substrate 66 forward and backwards relative to delivery head 10. Reciprocation motion can also be obtained by allowing a reciprocating motion of the delivery head 10 across an arc whose axis coincides with the roller axis, while the web substrate 66 is moved in a constant motion. In another embodiment at least a portion of delivery head 10 has an output face 36 having an amount of curvature (not shown), which might be advantageous for some web coating applications. Convex or concave curvature could be provided.

Optionally, the present process can be accomplished with other apparatus or systems described in more detail in commonly assigned U.S. Pat. Nos. 7,413,982, 7,456,429, 7,789, 961, and U.S. Publication No. 2009/0130858 (Levy) All above-identified applications incorporated by reference in their entirety.

In the embodiments in the latter three applications, a delivery device having an output face for providing gaseous materials for thin-film material deposition onto a substrate comprises elongated emissive channels in at least one group of elongated emissive channels, of the three groups of elongated emissive channels (namely, at least one group of: (i) one or more first elongated emissive channels, (i) one or more second elongated channels, and (iii) a plurality of third elongated channels) that is capable of directing a flow, respectively, of at least one of the first gaseous material, second gaseous material, and the third gaseous material substantially orthogonally with respect to the output face of the delivery device, which flow of gaseous material is capable of being provided, either directly or indirectly from each of the elongated emissive channels in the at least one group, substantially orthogonally to the surface of the substrate.

In one embodiment, apertured plates are disposed substantially in parallel to the output face, and apertures on at least one of the apertured plates form the first, second, and third elongated emissive channels. In an alternative embodiment, the apertured plates are substantially perpendicularly disposed with respect to the output face.

In one such embodiment, the deposition device comprises exhaust channels, for example, a delivery device for thin-film material deposition onto a substrate comprising: (a) a plurality of inlet ports comprising at least a first inlet port, a second inlet port, and a third inlet port capable of receiving a common supply for a first reactive gaseous material, a second reactive gaseous material, and a third (inert purge) gaseous material, respectively; (b) at least one exhaust port capable of receiving exhaust gas from thin-film material deposition and at least two elongated exhaust channels, each of the elongated exhaust channels capable of gaseous fluid communication with the at least one exhaust port; and (c) at least three pluralities of elongated output channels, (i) a first plurality of first elongated output channels, (ii) a second plurality of second elongated output channels, and (iii) a third plurality of third elongated output channels, each of the first, second, and third elongated output channels capable of gaseous fluid communication, respectively, with one of the corresponding first inlet port, second inlet port, and third inlet port; wherein each of the first, second, and third elongated output channels and each of the elongated exhaust channels extend in a length direction substantially in parallel; wherein each first elongated output channel is separated on at least one elongated side thereof from a nearest second elongated output channel by a relatively nearer elongated exhaust channel and a relatively less near third elongated output channel; and wherein each first elongated emissive channel and each second elongated emissive channel is situated between relatively nearer elongated exhaust channels and between relatively less nearer elongated emissive channels.

Further embodiments can comprise a gas diffuser associated with at least one group of the three groups of elongated emissive channels such that at least one of the first, second, and third gaseous material, respectively, is capable of passing through the gas diffuser prior to delivery from the delivery device to the substrate, during thin-film material deposition onto the substrate, and wherein the gas diffuser maintains flow isolation of the at least one of first, second, and third gaseous material downstream from each of the elongated emissive channels in the at least one group of elongated emissive channels.

In one embodiment such a gas diffuser is capable of providing a friction factor for gaseous material passing there through that is greater than $1 \times 10^2$, thereby providing back pressure and promoting equalization of pressure where the flow of the at least one first, second and third gaseous material exits the delivery device. In one embodiment of the invention, the gas diffuser comprises a porous material through which the at least one of the first, second, and third gaseous material passes. In a second embodiment of the invention, the gas diffuser comprises a mechanically formed assembly comprising at least two elements comprising interconnected passages, for example, in which nozzles are connected to a flow path provided by a thin space between parallel surface areas in the two elements.

In one embodiment, the one or more of the gas flows from the deposition devices provides a pressure that at least contributes to the separation of the surface of the substrate from the face of the delivery head, thereby providing a "floating head" or "air bearing" type deposition head, which can help to stabilize the gas flows and limit intermixing of the gas flows.

The process of the present invention is advantaged in its capability to perform deposition onto a substrate over a broad range of temperatures, including room or near-room temperature in some embodiments. The process of the present invention can operate in a vacuum environment, but is particularly well suited for operation at or near atmospheric pressure.

The various coating apparatus described above are preferred embodiments of the present invention. It should be recognized that any ALD equipment may be used with organosiloxane deposition inhibitor materials. Other spatial ALD processes, such as those as described by previously referenced Yudovsky and Suntola et al are also useful with the present invention, and as such represent alternate embodiments herein. Traditional chamber based or temporal ALD processes may also be employed with the organosiloxane deposition inhibitor materials of the present invention.

Figure 12A:
FIGS. 12A through 12E show the layers on the substrate at different points in the process in one embodiment of the present invention.
Figure 12B:
Figure 12C:
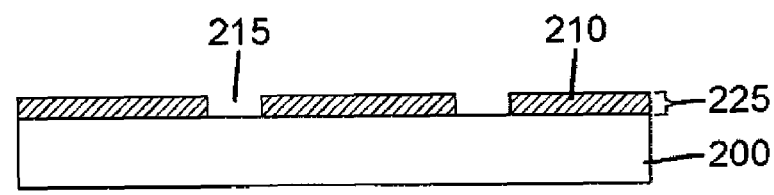
Figure 12D:
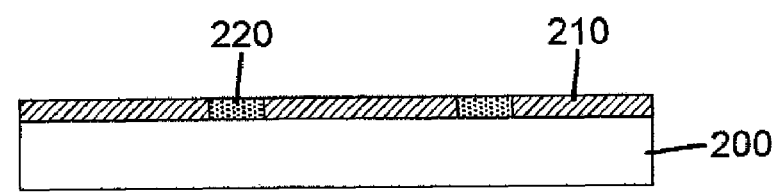
Figure 12E:
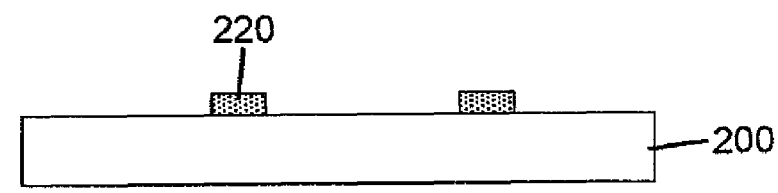

It is the goal of the present invention to provide a patterned thin film that is not only deposited via an ALD process, but simultaneously patterned using selective area deposition (SAD) materials and processes. As described above, SAD processes use a deposition inhibitor compound in order to inhibit the ALD growth of the thin film in the non-selected areas. This process can be better understood with reference to FIGS. 12A through 12E. FIG. 12A shows a substrate 200 prior to the application of the deposition inhibitor material 210. Although the substrate 200 is illustrated as a bare substrate, one skilled in the art should recognize that substrate 200 might contain layers of materials, either patterned or unpatterned, to serve any purpose electrical, optical, or mechanical, as desired. FIG. 12B shows a substrate 200 after a uniform deposition of deposition inhibitor material 210. FIG. 12C illustrates substrate 200 after the step of patterning the deposition inhibitor material 210 into deposition mask 225. The patterning can be done by any method known in the art, including photolithography using either positive or negative acting photoresists, laser ablation, or other subtractive processes. As shown, deposition mask 225 contains areas of deposition inhibitor material 210 and areas of substrate for deposition 215. FIG. 12D illustrates substrate 200 after the step of atomic layer deposition of the desired thin film material. As shown, thin film material 220 is only deposited on the substrate 200 where there was no deposition inhibitor material 210. The thin film material 220 does not form any appreciable thin film over deposition inhibitor material 210. FIG. 12E illustrates a patterned thin film material 220 after removing the deposition inhibitor material 210. It should be understood by one skilled in the art, that in some instances it would not be necessary to remove the deposition inhibitor material 210.

Figure 13A:
FIGS. 13A through 13D show the layers on the substrate at different points in another embodiment of the present invention.
Figure 13B:
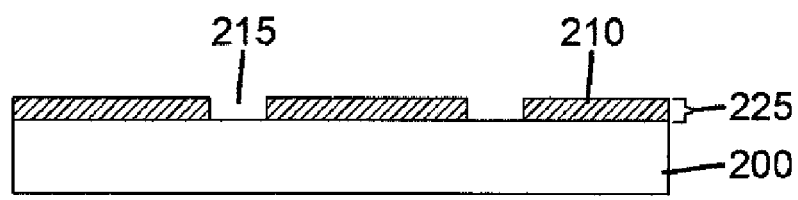
Figure 13C:
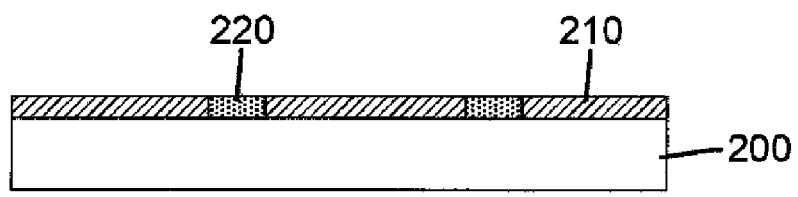
Figure 13D:
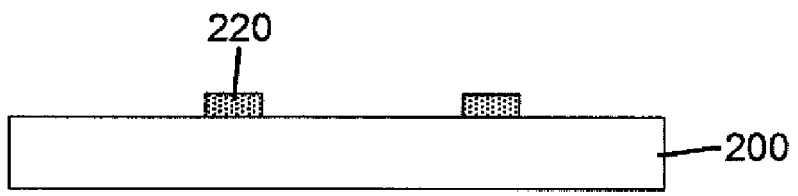

FIGS. 13A, 13C and 13D should be understood with respect to the descriptions of 12A, 12D and 12E respectively. FIG. 13B illustrates a deposition mask 225 formed by patterned deposition of the deposition inhibitor material 210. Patterned deposition may be done using any additive printing method including, but not limited to: inkjet, gravure, flexography, patch coating, screen printing, donor transfer, micro contact printing, or offset lithography.

EXAMPLES

Description of the Coating Apparatus

Figure 14:
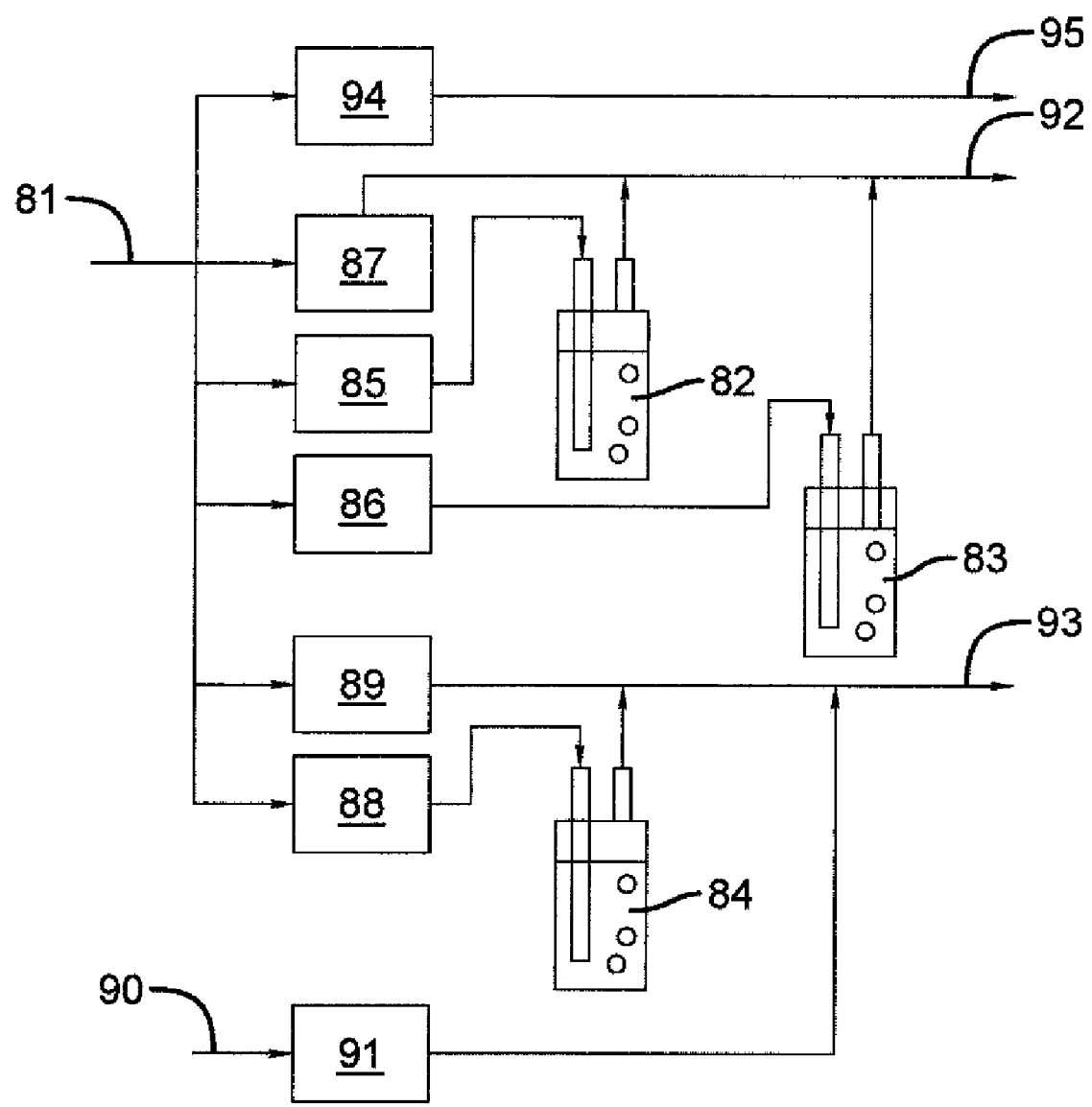
FIG. 14 is a cross-sectional side view of a deposition device used in an embodiment of the present process, showing the arrangement of gaseous materials provided to a substrate that is subject to thin film deposition process of the Examples.

All of the following thin film examples employ a flow setup as indicated in FIG. 14. The flow setup is supplied with nitrogen gas flow 81 that has been purified to remove oxygen and water contamination to below 1 ppm. The gas is diverted by a manifold to several flow meters which control flows of purge gases and of gases diverted through bubblers to select the reactive precursors. In addition to the nitrogen supply, air flow 90 is also delivered to the apparatus. The air is pretreated to remove moisture.

The following flows are delivered to the ALD coating apparatus: metal (zinc) precursor flow 92 containing metal precursors diluted in nitrogen gas; oxidizer-containing flow 93 containing non-metal precursors or oxidizers diluted in nitrogen gas; nitrogen purge flow 95 composed only of the inert gas. The composition and flows of these streams are controlled as described below.

Gas bubbler 83 contains liquid dimethylaluminum isopropoxide (DMAI). Flow meter 86 delivers flows of pure nitrogen to the dimethylaluminum isopropoxide bubbler 83. The output of the bubbler 83 now contains nitrogen gas saturated with the respective precursor solution. The output flow is mixed with a nitrogen gas dilution flow delivered from flow meter 87 to yield the overall flow of metal precursor flow 92. In the following examples, the flows will be as follows:

| Flow meter 86: | To Dimethylaluminum isopropoxide Bubbler Flow |
|---|---|
| Flow meter 87: | To Metal Precursor Dilution Flow |

Gas bubbler 84 contains pure water at room temperature. Flow meter 88 delivers a flow of pure nitrogen to gas bubbler 84, the output of which represents a stream of saturated water vapor. An airflow is controlled by flow meter 91. The water bubbler output and air streams are mixed with dilution stream from flow meter 89 to produce the overall flow of oxidizer-containing flow 93 which has a variable water vapor composition, nitrogen composition, and total flow. In the following examples, the flows will be as follows:

| Flow meter 88: | To Water Bubbler |
|---|---|
| Flow meter 89: | To Oxidizer Dilution Flow |
| Flow meter 91: | To Air Flow |

Flow meter 94 controls the flow of pure nitrogen that is to be delivered to the coating apparatus.

Figure 15:
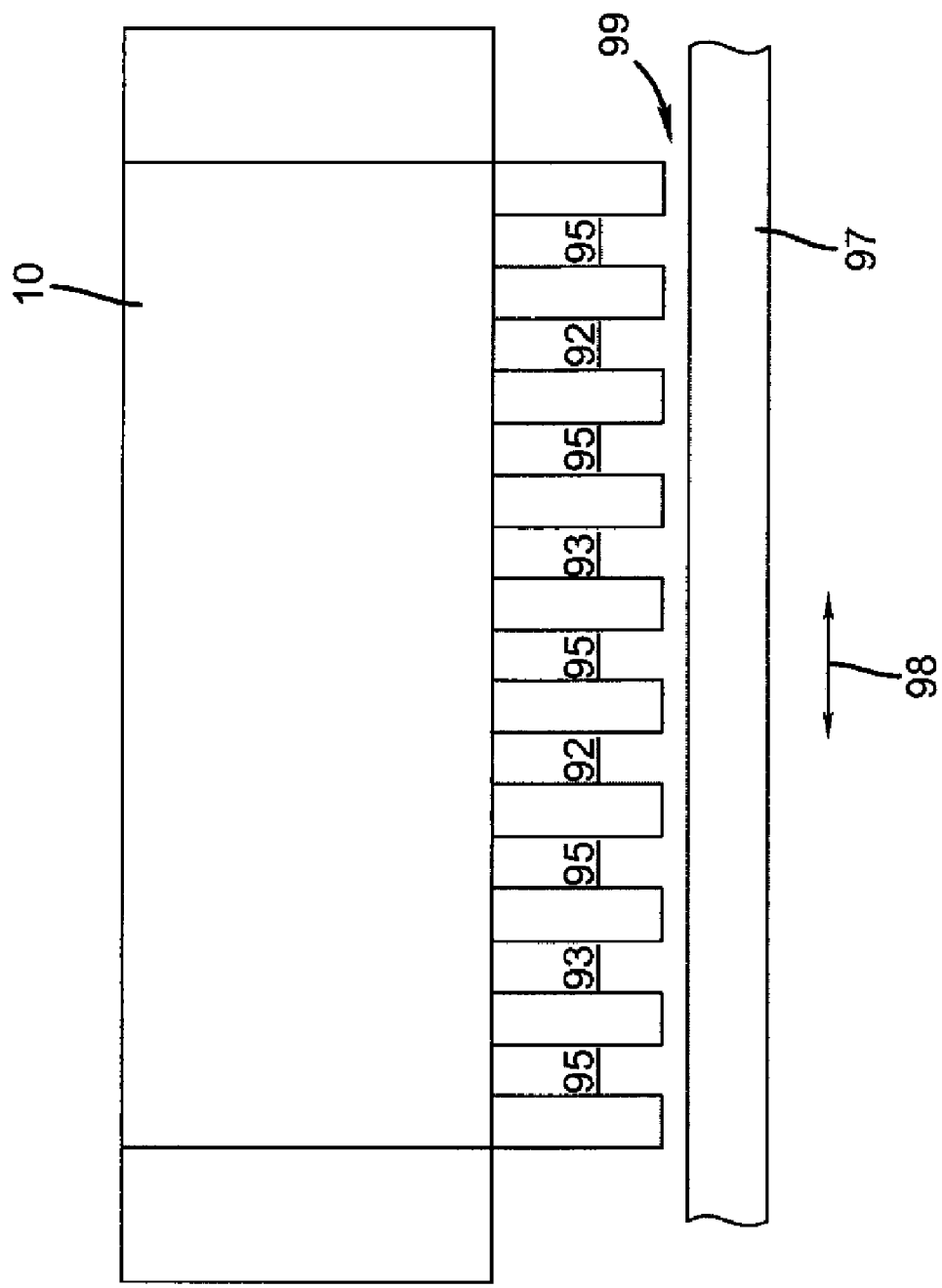
FIG. 15 is a cross-sectional side view of a deposition device used in the process of FIG. 14, showing the arrangement of gaseous materials provided to a substrate that is subject to the thin film deposition process of the Examples.

Streams or Flows 92, 93, and 95 are then delivered to an atmospheric pressure coating head where they are directed out of the channels or microchamber slots as indicated in FIG. 15. A gap 99 of approximately 0.15 mm 30 microns exists between the elongated channels and the substrate 97. The microchambers are approximately 2.5 mm tall, 0.86 mm wide, and run the length of the coating head which is 76 mm. The reactant materials in this configuration are delivered to the middle of the slot and flow out of the front and back.

In order to perform a deposition, the delivery head is positioned over a portion of the substrate 97 and then moved in a reciprocating fashion over the substrate 97, as represented by the arrow 98. The length of the reciprocation cycle was 32 mm. The rate of motion of the reciprocation cycle is 30 mm/sec.

Materials Used:
(1) Si wafer substrates, cut to 2.5×2.5" squares, previously cleaned in Piranha solution, washed with distilled water, reagent ethanol and dried.
(2) Dimethylaluminum isopropoxide (commercially available from Strem Chemical Co.).
(3) Various SAD polymers DEHESIVE 944 is a vinyl-terminated dimethylsiloxane polymer supplied by Wacker Chemie AG. Cross linker V24 is a methylhydrogenpolysiloxane supplied by Wacker. Catalyst OL is an organoplatinum complex in polydimethylsiloxane, also supplied by Wacker. Cross linker V24 and Catalyst OL are used for additional curing of vinyl-terminated siloxane polymers such as DEHESIVE 944.

FMV-4031 and PDV-1625 are partially fluorinated and partially phenylated vinyl-terminated dimethylsiloxane polymers, respectively. SIP6830.3, an organoplatinum complex solution in polydimethylsiloxane, and HMS-301, a methyl-hydrosiloxane-dimethylsiloxane copolymer, are a catalyst and a cross linker for additional curing of vinyl-terminated siloxane polymers such as FMV-4031 and PDV-1625, respectively. FMV-4031, PDV-1625, HMS-301, and SIP6830.3 are supplied by Gelest Inc.

Heptadecafluoro-1,1,2,2-tetrahydrodecyltrichlorosilane was purchased from Gelest Inc.

950 PMMA is a poly(methyl methacrylate) based positive working photoresist supplied by MicroChem.

CT2000L is a photoresist supplied by Fuji Photochemicals.

Comparative Example 1

Preparation of $Al_2O_3$ Dielectric Layer Using Atmospheric Pressure ALD Process This example describes the preparation of a thin film coating of an $Al_2O_3$ layer on a Si wafer substrate. The device used to prepare the $Al_2O_3$ and ZnO layers has been described in detail in U.S. patent application Ser. No. 11/627,525, hereby incorporated by reference in its entirety. A 2.5×2.5 inch square (62.5 mm square) Si wafer was positioned on the platen of this device, held in place by a vacuum assist and heated to 200° C. The platen with the Si substrate was positioned under the coating head that directs the flow of the active precursor gasses. The spacing between the Si wafer substrate and the coating head was adjusted using a micrometer to 30 microns.

The coating head has isolated channels through which flow: (1) inert nitrogen gas; (2) a mixture of nitrogen, air and water vapor; and (3) a mixture of active metal alkyl vapor (DMAI) in nitrogen. The flow rate of the active metal alkyl vapor was controlled by bubbling nitrogen through the pure liquid DMAI contained in an airtight bubbler by means of individual mass flow control meters. Due to the relatively low vapor pressure of DMAI at room temperature the DMAI bubbler and delivery line to the coating head were heated to 60 C. The temperature of the coating head was also maintained at 60° C. The flow of water vapor was controlled by adjusting the bubbling rate of nitrogen passed through pure water in a bubbler. Adjusting the flow rates of the individual gasses to the settings shown in Table 1, for Example 1 below, the coating process was initiated by oscillating the coating head across the substrate for the number of cycles specified. The finished coating was a completely uniform deposit of $Al_2O_3$ having an average thickness of 1125 Å.

TABLE 1

| Sample | Layer | Me₂Al—iOPr* | Et₂Zn | Water | N₂ carrier with Metal Alkyl | N₂ carrier for water | N₂ Inert Purge | Cycles | Substrate Temperature ° C. |
|---|---|---|---|---|---|---|---|---|---|
| 1 | $Al_2O_3$ | 100 | 0 | 15 | 45 | 90 | 644 | 400 | 200 |
| 2 | ZnO | 0 | 13 | 15 | 45 | 90 | 644 | 300 | 200 |

*Flow values in sccm (standard cubic centimeters/min)

Comparative Example 2

Preparation of ZnO Semiconductor Layer Using Atmospheric Pressure ALD Process This example describes the preparation of a thin film coating a ZnO layer on a Si wafer substrate and. A 2.5×2.5 inch square (62.5 mm square) Si wafer was positioned on the platen of the ALD device, held in place by a vacuum assist and heated to 200° C. The platen with the Si substrate was positioned under the coating head that directs the flow of the active precursor gasses. The spacing between the Si wafer substrate and the coating head was adjusted using a micrometer to 30 microns.

The coating head has isolated channels through which flow: (1) inert nitrogen gas; (2) a mixture of nitrogen, air, and water vapor; and (3) a mixture of active metal alkyl vapor (Diethyl zinc, DEZ) in nitrogen. The flow rate of the active metal alkyl vapor was controlled by bubbling nitrogen through the pure liquid DEZ contained in an airtight bubbler by means of individual mass flow control meters. The flow of water vapor was controlled by adjusting the bubbling rate of nitrogen passed through pure water in a bubbler. Adjusting the flow rates of the individual gasses to the settings shown in Table 1, for Example 2 below, the coating process was initiated by oscillating the coating head across the substrate for the number of cycles specified. The finished coating was a completely uniform deposit of ZnO having an average thickness of 565 Å.

Example 1

Selective Area Deposition (SAD) of $Al_2O_3$ Dielectric Layer by Siloxane Polymer Solutions of Part A and Part B of DEHENSIVE 944 vinyl-terminated dimethylsiloxane polymer ("siloxane polymer") were prepared by dissolving ingredients in a mixture of toluene and heptane according to the formulation specified in Table 2. Equal amount of Parts A and B were then mixed and diluted by a factor of 10 using a mixture of toluene and heptane (33/48 ratio) to form the stock solution of the siloxane polymer.

TABLE 2

| Ingredient | Part A | Part B |
|---|---|---|
| Siloxane Polymer (30% Solid) | 90.0 | 90.0 |
| Crosslinker V24 | 0.1 | 0.0 |
| Catalyst OL | 0.0 | 3.0 |
| Toluene | 2000.0 | 2000.0 |
| Heptane | 2910.0 | 2910.0 |

The capability of SAD of $Al_2O_3$ by the siloxane polymer was then tested by coating half of a Si wafer with the siloxane-polymer stock solution. Half of the Si wafer was taped off with a Kapton sheet by scotch tape, and the siloxane-polymer stock solution was spun onto the untapped half (3 k RPM for 1 min). The tape and KAPTON polymer sheet and tape were removed and the wafer wiped with methanol to remove tape residue (siloxane-polymer coated side was not wiped). The wafer was then heated at 120° C. for 2 minutes before being subjected to a $Al_2O_3$ deposition, using DMAI precursor, following the same procedure as described by Comparative Example 1. After 300 deposition cycles, a uniform film of $Al_2O_3$ with an average thickness of 960 Å was formed on the un-protected side of the wafer, but no detectable deposition was found on the siloxane-polymer covered side.

Example 2

Selective Area Deposition (SAD) of ZnO Semiconductor Layer by Siloxane Polymer A Si wafer, half side coated with a thin layer of DEHESIVE 944 siloxane polymer as described in Example 1, was subject to ZnO deposition following the same procedure as described in Comparative Example 2. After 300 deposition cycles, a uniform film of ZnO with an average thickness of 565 Å was formed on the un-protected side, but no detectable deposition of ZnO was found on the siloxane-polymer protected side.

Example 3

Selective Area Deposition (SAD) of IZO Semiconductor Layer by Siloxane Polymer A Si wafer, with a half side coated with a thin layer of DEHESIVE 944 siloxane polymer as described in Example 1, was subject to InZnO (IZO) deposition following the same procedure as described in Comparative Example 2, except that a flow of trimethylindium vapor was combined with the diethyl zinc flow. The solid trimethylindium (TMI) precursor was contained in a glass bubbler and its vapor was entrained in a flow of nitrogen. The relative ratios of nitrogen flow into the DEZ and TMI bubblers were 13 and 80 sccm, respectively. The Si wafer was maintained at a temperature of 240° C. After 300 deposition cycles, a uniform film of IZO was deposited having an average thickness of 565 Å on the un-protected side, but no detectable deposition of IZO was found on the siloxane-polymer protected side.

Example 4

Selective Area Deposition (SAD) of ZnO Semiconductor Layer by Fluorinated Siloxane Polymer Solutions of Part A and Part B of FMV-4031 partially fluorinated vinyl-terminated dimethylsiloxane polymers were prepared by dissolving ingredients in a mixture of toluene and heptane according to the formulation specified in Table 3 below. Equal amount of Parts A and B were then mixed and diluted by a factor of 10 using a mixture of toluene and heptane (33/48 ratio) to form the stock solution of the fluorinated siloxane polymer.

TABLE 3

| Ingredient | Part A | Part B |
| --- | --- | --- |
| Fluorinated Siloxane FMV-4031 | 49.0 | 45.0 |
| SIP6830.3 | 0.1 | 0.0 |
| HMS301 | 0.0 | 5.0 |
| Toluene | 2017.0 | 1996.0 |
| Heptane | 2934.0 | 2904.0 |

Capability of SAD of ZnO by the fluorinated siloxane polymer FMV-4031 was then tested by the same procedure as described by Comparative Example 2. After 300 deposition cycles, a uniform film of ZnO with an average thickness of 415 Å was formed on the unprotected side of the wafer, but no detectable deposition was found on the side covered by the partially fluorinated siloxane polymer.

Example 5

Selective Area Deposition (SAD) of ZnO Semiconductor Layer by Phenylated Siloxane Polymer Solutions of Part A and Part B of partially phenylated vinyl-terminated dimethylsiloxane polymers PDV-1625 were prepared by dissolving ingredients in a mixture of toluene and heptane according to the formulation specified in Table 4 below. Equal amount of Parts A and B were then mixed and diluted by a factor of 10 using a mixture of toluene and heptane (33/48 ratio) to form the stock solution of partially phenylated vinyl-terminated dimethylsiloxane polymer.

TABLE 4

| Ingredient | Part A | Part B |
| --- | --- | --- |
| Phenylated siloxane polymer PDV-1625 | 49.0 | 45.0 |
| SIP6830.3 | 0.1 | 0.0 |
| HMS301 | 0.0 | 5.0 |
| Toluene | 2017.0 | 1996.0 |
| Heptane | 2934.0 | 2904.0 |

The capability of SAD of ZnO by fluorinated siloxane polymer was then tested by the same procedure as described by Comparative Example 2. After 300 deposition cycles, a uniform film of ZnO with an average thickness of 425 Å was formed on the un-protected side of the wafer, but no detectable deposition was found on the PDV-1625 siloxane covered side.

Example 6

Preparation of a Patterned $Al_2O_3$ Dielectric Layer by a Sad Polymer Using Atmospheric Pressure ALD Process This example describes the preparation of a thin film coating of a patterned $Al_2O_3$ layer (Sample 2) that is comprised of a Si wafer substrate, a patterned layer of a SAD polymer, a 1100 Å thick $Al_2O_3$ dielectric layer that is deposited in the areas that the SAD polymer does not cover.

The patterned layer of a deposition inhibition polymer was prepared according the following steps:
1. Spin coating a mixture of 5 parts of 0.4% of 950 PMMA solution in Anisole/toluene and 1 part of the DEHESIVE 944 polysiloxane in toluene/heptane at 3000 rpm.
2. After heating at 120 to 180 C for 1-2 minutes, the coated sample was exposed under deep UV for 5-15 minutes through a gridline-patterned photo mask in presence of nitrogen.
3. The exposed sample was then developed by toluene for 45 to 90 seconds, followed by 3 rinses. Exposed area was removed during the development step.

Figure 16:
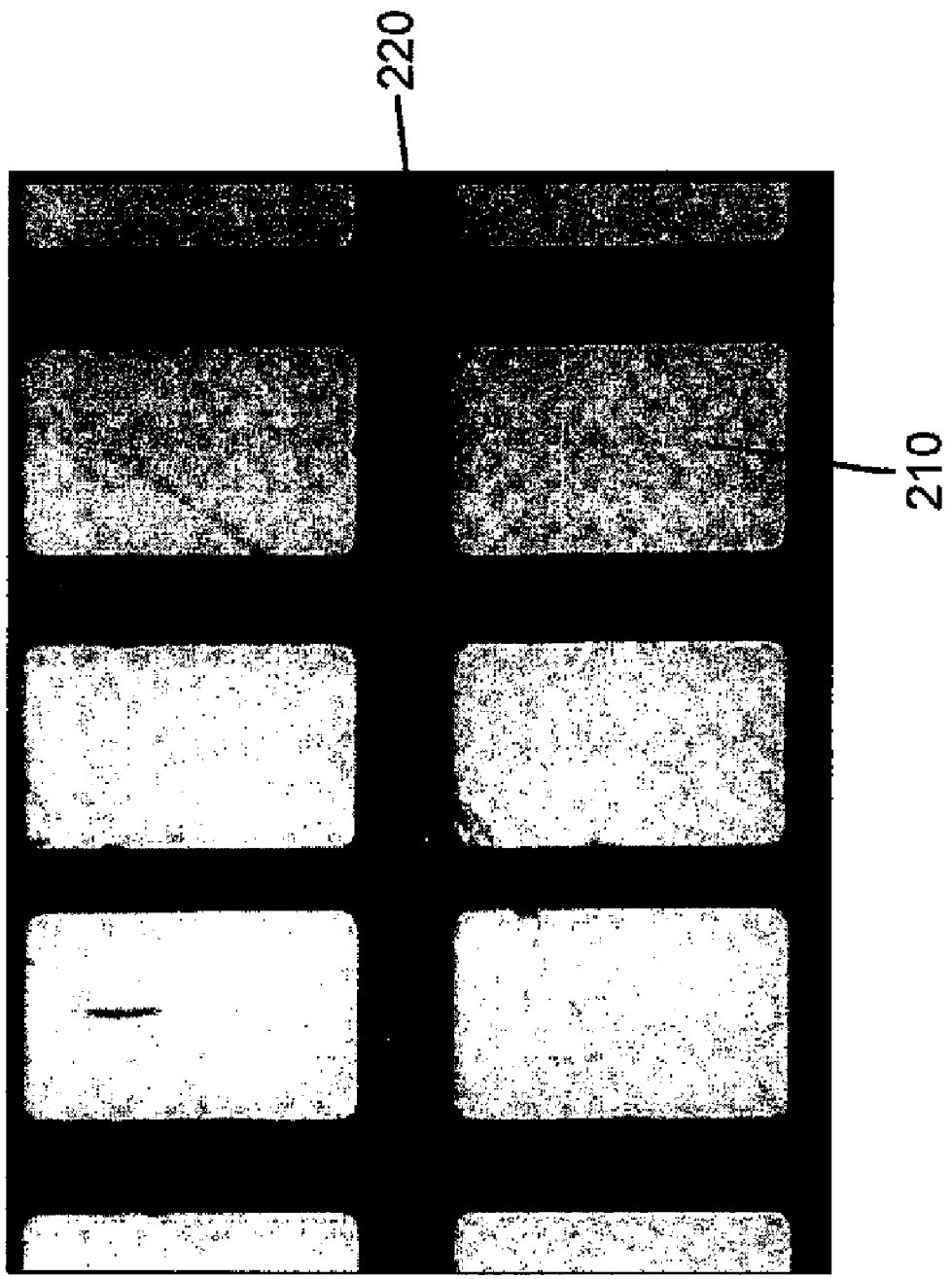
FIG. 16 is a photograph of a patterned thin film made by one embodiment of the present invention.

The substrate with a patterned layer of deposition inhibition polymer was then subjected to $Al_2O_3$ deposition. The patterned $Al_2O_3$ coating is prepared identically to that procedure in Comparative Example 1 above. The finished patterned coating appeared as a sharp gridline pattern of $Al_2O_3$ lines. FIG. 16 is a photograph of completed Example 21; the patterned thin film 220 is $Al_2O_3$ and the deposition inhibition materials 210 can be seen as the open spaces.

Example 7

Preparation of a Patterned ZnO Semiconductor Layer by a Deposition Inhibitor Polymer Using Atmospheric Pressure ALD Process This example describes the preparation of a thin film coating of a patterned ZnO layer that is comprised of a Si wafer substrate, a patterned layer of a deposition inhibitor polymer, a 1000 Å thick ZnO semiconductor layer that is deposited in the areas that the SAD polymer does not cover.

The patterned layer of a deposition inhibitor was prepared according the procedure described in Example 6.

The substrate with a patterned layer of deposition inhibitor was then subjected to ZnO deposition. The patterned ZnO coating is prepared identically to the procedure in Comparative Example 2 above. The finished patterned coating appeared as a sharp gridline pattern of ZnO lines.

Example 8

This example illustrates the formation of a patterned zinc oxide coating. A deposition inhibitor is printed on a silicon wafer. Deposition of zinc oxide was accomplished using an atmospheric pressure ALD coating head, resulting in selective growth of the zinc oxide film in regions without the deposition inhibitor.

A silicon wafer was washed for 10 minutes by treating in a solution of 70% sulfuric acid and 30% solution of 30% hydrogen peroxide maintained at approximately 100° C. and then treated for 3 minutes in oxygen plasma. To 5 cc of decane, a drop of the director (heptadecafluoro-1,1,2,2-tetra-hydrodecyl)tricholorosilane was added using a spotting capillary. A thin layer of the resulting solution was applied to a poly (dimethylsiloxane) (PDMS) elastomeric stamp which had a patterned relief structure in its surface. The stamp was held under flowing nitrogen until it appeared dry, and then the stamp was brought in contact with the cleaned silicon wafer and held for three minutes. Using this procedure, the raised portions of the PDMS relief structure were used to transfer molecules of the director to the surface of the substrate forming a deposition inhibitor pattern. After printing, a zinc oxide coating was applied to the substrate using an atmospheric pressure ALD coating head. The resulting zinc oxide film grew in a pattern, with selective deposition of zinc oxide on regions that were not treated with the director layer. Optical inspection of the resulting sample showed that the oxide film was deposited preferentially on regions that were not treated with the director. Profilometry of the patterned region showed the printed deposition inhibitor had an inhibition power of 200 Å. As defined above, the inhibition power is defined as the layer thickness at or below which there is substantially no thin film formed on the deposition inhibitor surface. The inhibition power value is calculated as the difference between the thin film formed on the deposition inhibitor material surface, and the film formed on the substrate.

Example 9

Examples 9 and 10 illustrate the formation of patterned zinc oxide and aluminum oxide coatings using a direct print process to deposit the deposition inhibitor. A pattern of the deposition inhibitor was printed on a silicon wafer. Aluminum oxide was deposited using an atmospheric pressure ALD coating head. This resulted in selective growth of the oxide film in regions uncovered by the director.

A silicon wafer was washed for 10 minutes by treating in a solution of 70% sulfuric acid and 30% solution of 30% hydrogen peroxide maintained at approximately 100° C. and then treated for 3 minutes in oxygen plasma. A director solution was prepared as described in Example 1. A thin layer of this solution was applied to a poly(dimethylsiloxane) (PDMS) elastomeric stamp which had a patterned relief structure in its surface. The stamp was held under flowing nitrogen for 1 minute, and then the stamp was brought in contact with the cleaned silicon wafer and held for three minutes. The stamp was removed from the sample and then the sample was heated on a hotplate at 120° C. for 2 minutes. Using this procedure, the raised portions of the PDMS relief structure were used to transfer molecules of the director to the surface of the substrate forming a director pattern. After printing, an aluminum oxide coating was applied to the substrate using an atmospheric pressure ALD coating head as described in comparative Example 1. The resulting aluminum oxide film grew in a pattern, with no detectable deposition of aluminum oxide on regions that were treated with the deposition inhibitor layer.

Example 10

A sample was prepared in identical fashion as described for Example 9, except a zinc oxide coating was deposited on the patterned director layer. The resulting zinc oxide film grew in a pattern, with no detectable deposition of zinc oxide on regions that were treated with the deposition inhibitor layer.

PARTS LIST

| PARTS LIST | |
|---|---|
| 1 | continuous supply of gaseous materials for system |
| 2 | first channel flow of first molecular precursor over channel area of substrate |
| 3 | relative movement of substrate and multi-channel flows |
| 4 | second channel flow with inert gas over channel area |
| 5 | relative movement of substrate and multi-channel flows |
| 6 | third channel flow of second molecular precursor over channel area |
| 7 | relative movement of substrate and multi-channel flows |
| 8 | fourth channel flow with inert gas over channel area |
| 9 | relative movement of substrate and multi-channel flow |
| 10 | delivery head |
| 11 | multiple channel flow in parallel |
| 12 | output channel |
| 13 | partitions |
| 14, 16, 18 | gas inlet port |
| 15 | sequence |
| 20 | substrate |
| 22 | exhaust channels |
| 24 | gas output port |
| 26 | exhaust port |
| 28a, 28b, 28c | gas supply |
| 30 | actuator |
| 32 | supply line |
| 36 | output face |

-continued

| PARTS LIST | |
|---|---|
| 50 | chamber |
| 52 | transport motor |
| 54 | transport subsystem |
| 56 | control logic processor |
| 58 | baffle |
| 60 | Atomic Layer Deposition (ALD) process |
| 62 | web conveyor |
| 66 | web substrate |
| 70 | Atomic Layer Deposition (ALD) system |
| 74 | substrate support |
| 81 | nitrogen gas flow |
| 82, 83, 84 | gas bubbler |
| 85, 86, 87, 88, 89 | flow meter |
| 91, 94 | flow meter |
| 90 | air flow |
| 92 | metal precursor flow |
| 93 | oxidizer-containing flow |
| 95 | nitrogen purge flow |
| 96 | substrate support |
| 97 | example substrate |
| 98 | arrow |
| 99 | gap |
| 100 | providing a substrate |
| 105 | applying the deposition inhibitor material |
| 110 | patterning the deposition inhibitor material |
| 120 | ALD |
| 130 | removing the deposition inhibitor material |
| 200 | substrate |
| 210 | deposition inhibitor material |
| 215 | portion of substrate for deposition |
| 220 | patterned thin film material |
| 225 | deposition mask |
| A | arrow |
| D | distance |
| F1, F2, $F_I$, $F_O$, $F_M$ | gas flow |
| I | inert gaseous material |
| M | second reactant gaseous material |
| O | first reactant gaseous material |
| R | arrow |
| X | arrow |

The invention claimed is:

1. An atomic layer deposition process for forming a patterned inorganic thin film comprising:
    (a) providing a substrate;
    (b) applying a composition comprising a deposition inhibitor material to the substrate, wherein the deposition inhibitor material comprises an organosiloxane polymer, which may optionally be crosslinked;
    (c) patterning the deposition inhibitor material, either after step (b) or simultaneously with applying the deposition inhibitor material to provide selected areas effectively not having the deposition inhibitor material; and
    (d) depositing an inorganic thin film on the substrate by atomic layer deposition;
    wherein the inorganic thin film is substantially deposited only in the selected areas of the substrate not having the deposition inhibitor material and
    wherein the organosiloxane polymer is a fluorinated or partially fluorinated organosiloxane polymer.

2. The process of claim 1 wherein the organosiloxane polymer is crosslinked after applying the polymer onto the substrate, before or during patterning in step (c).

3. The process of claim 1 wherein the composition comprising the deposition inhibitor material further comprises a radiation-sensitive polymer.

4. The process of claim 3 wherein the radiation-sensitive polymer is poly(methyl methacrylate).

5. The process of claim 1 wherein the inorganic thin film is a metal or comprises a metal-containing compound.

6. The process of claim 5 wherein the metal-containing compound comprises a group V or group VI anion.

7. The process of claim 5 wherein the metal-containing compound is an oxide, nitride, sulfide, or phosphide.

8. The process of claim 5 wherein the metal-containing compound contains zinc, aluminum, titanium, hafnium, zirconium, and/or indium.

9. The process of claim 5 wherein the metal is copper, tungsten, aluminum, nickel, ruthenium, or rhodium.

10. The process of claim 1 wherein the deposition inhibitor material has an inhibition power of at least 200 Å during use.

11. The process of claim 1 wherein the processes of applying and patterning the deposition inhibitor material comprises depositing a uniform layer of deposition inhibitor material and subsequently patterning the layer.

12. The process of claim 1 where in the processes of applying and patterning the deposition inhibitor material comprises pattern-wise depositing the deposition inhibitor material.

13. The process of claim 12 wherein the pattern-wise deposition is inkjet printing, gravure, flexography, donor transfer, micro-contact printing, or offset lithography.

14. The process of claim 1 wherein the atomic layer deposition comprises spatially dependent ALD.

15. The process of claim 14 wherein the spatially dependent ALD comprises: simultaneously directing a series of gas flows along elongated substantially parallel channels, and wherein the series of gas flows comprise, in order, at least a first reactive gaseous material, an inert purge gas, and a second reactive gaseous material, optionally repeated a plurality of times, to form the thin film, and wherein the process is carried out substantially at or above atmospheric pressure, and wherein the temperature of the substrate during deposition is under 250° C.

16. The process of claim 15 wherein the series of gas flows are provided by a deposition device comprising, facing the substrate in plain view, a series of open elongated output openings, substantially in parallel, positioned over the substrate in close proximity thereto, in an output face of a deposition device spaced within 1 mm from the surface of the substrate subject to atomic layer deposition.

17. The process of claim 16 wherein there are elongated exhaust openings between the series of open elongated output openings for the first reactive gaseous material and the second reactive gaseous material.

18. The process of claim 1 wherein a given area of the substrate is exposed to a gas flow in an elongated output opening for less than 100 milliseconds.

19. The process of claim 15 wherein the second reactive gaseous material is a non-metallic compound.

20. The process of claim 16 wherein a surface area of the substrate exceeds a surface area of the output face of the deposition device.

* * * * *

UNITED STATES PATENT AND TRADEMARK OFFICE
CERTIFICATE OF CORRECTION

PATENT NO.         : 8,017,183 B2
APPLICATION NO.    : 11/861705
DATED              : September 13, 2011
INVENTOR(S)        : Yang et al.

It is certified that error appears in the above-identified patent and that said Letters Patent is hereby corrected as shown below:

In Column 1, lines 8-15, delete

"The present application is related to U.S. Pat. Nos. 7,413,982, 7,456,429 (Levy), U.S. Application Publication No. (Levy), U.S. Pat. No. 7,789,961 (Nelson et al.) U.S. Application Publication Nos. 2009/0078204 and 2009/0081366-Kerr et al.) U.S. Application Pat. No. 7,572,686 (Levy et al.) and U.S. Application Publication No. 2009/0081827 (Yang et al.) all the above identified applications hereby incorporated by reference in their entirety."

and insert

-- The present application is related to U.S. Pat Nos. 7,413,982, 7,456,429 (Levy), and 7,789,961 (Nelson et al.), U.S. Application Publication Nos. 2009/0078204 and 2009/0081366 (Kerr et al.), U.S. Pat. No. 7,572,686 (Levy et al.), and U.S. Application Publication No. 2009/0081827 (Yang et al.), all the above identified applications hereby incorporated by reference in their entirety. --.

Signed and Sealed this
Ninth Day of April, 2013

Teresa Stanek Rea
*Acting Director of the United States Patent and Trademark Office*